United States Patent [19]
Matsubara et al.

[11] Patent Number: 5,580,826
[45] Date of Patent: Dec. 3, 1996

[54] PROCESS FOR FORMING A PLANARIZED INTERLAYER INSULATING FILM IN A SEMICONDUCTOR DEVICE USING A PERIODIC RESIST PATTERN

[75] Inventors: Yoshihisa Matsubara; Shinya Ito, both of Tokyo, Japan

[73] Assignee: NEC Corporation, Japan

[21] Appl. No.: 341,081

[22] Filed: Nov. 17, 1994

[30] Foreign Application Priority Data

Nov. 17, 1993 [JP] Japan .................................. 5-287893
Dec. 3, 1993 [JP] Japan .................................. 5-304195

[51] Int. Cl.$^6$ .................................................. H01L 21/28
[52] U.S. Cl. .......................... 437/195; 437/228; 437/229
[58] Field of Search ................................ 437/195, 228, 437/229; 237/758, 751; 216/38

[56] References Cited

U.S. PATENT DOCUMENTS 5,077,234  12/1991  Scoopo et al. ........................... 437/228
5,212,114   5/1993  Grewal et al. ........................... 437/228
5,292,689   3/1994  Cronin et al. ........................... 437/228

FOREIGN PATENT DOCUMENTS 60-245229  12/1985  Japan .
61-287245  12/1986  Japan .................................. 437/228
02271617  11/1990  Japan .................................. 437/228

OTHER PUBLICATIONS

"A Four–Level–Metal Fully Planarized Interconnect Technology For Dense High Performance Logic and SRAM Applications"; Ronald R. Uttecht and Robert M. Geffken; IBM General Technology Division; 1991 VMIC Conference; p. 20.

"A New Interlayer Formation Technology For Completely Planarized Multilevel Interconnection by Using LPD"; T. Homma et al.; NEC Corporation; 1990 IEEE; 1990 Symposium on VLSI Technology; pp. 3 and 4.

"Two–Layer Planarization Process"; A. Schiltz and M. Pans; Centre National d'Etudes des Telecommunications, Zirst, Meyland, France; J. Electrochem. Soc.; vol. 133, No. 1; pp. 178–181 (Jan. 1986).

"A Planarization Technology Using a Bias–Deposited Dielectric film and an Etch–Back Process"; Shinji Fujii, et al.; IEEE Transactions on Electron Devices, vol. 35, No. 11, Nov. 1988; pp. 1829–1833.

"Application of a Two–layer Planarization Process to VLSI Intermetal Dielectric and Trench Isolation Processes"; D. J. Sheldon et al.; 1988 IEEE; pp. 140–146.

"A High Performance, Four Metal Layer Interconnect System for Bipolar and BICMOS Circuits"; S. R. Wilson et al.; Advanced Technology Center; Motorola Semiconductor Products Sector; 1990 VMIC Conference; pp. 42–47.

Primary Examiner—George Fourson
Assistant Examiner—Thomas G. Bilodeau
Attorney, Agent, or Firm—Whitham, Curtis, Whitham & McGinn

[57] ABSTRACT

In a process for manufacturing a semiconductor device, on a surface including interconnections selectively formed on an insulating film, an interlayer insulating film to have a thickness thicker than that of the interconnections is deposited. A positive type photoresist is deposited, and then, exposed through a mask having a regular stripe pattern extending over the whole of the mask, while causing an exposing light to focus on a low altitude region of the interlayer insulating film. The photoresist is developed, with the result that a regular pattern of the developed photoresist is formed on only a low altitude region. A second resist is deposited on a surface including the first resist so as to cause the second resist to have a substantially planarized surface. Then, an etch-back is performed for a whole surface at least until a surface of the low altitude region of the interlayer insulating film is exposed, whereby an upper surface of the interlayer insulating film is planarized.

14 Claims, 18 Drawing Sheets

PROCESS FOR FORMING A PLANARIZED INTERLAYER INSULATING FILM IN A SEMICONDUCTOR DEVICE USING A PERIODIC RESIST PATTERN

BACKGROUND OF THE INVENTION

1. Field of the Invention

The present invention relates to a method for manufacturing a semiconductor device, and more specifically, to a process for forming a planarized surface in a semiconductor device having a multilevel interconnection structure.

2. Description of Related Art

With advanced fine patterning in LSI (large scale integrated circuit) technology, pitches of interconnection conductors have also been reduced, and simultaneously, the number of interconnection conductor levels is also increased. Because of the increase of the number of interconnection conductor levels, a so-called altitude difference becomes large. Here, the altitude difference means the difference between a height from a silicon substrate surface to a top surface of an interlayer film in a region in which no interconnection conductor is formed, and a height from a silicon substrate surface to an top surface of an interlayer film in another region in which an interconnection conductor is formed. In the case of carrying out, on this interlayer film having undulations, a lithography, for example, a patterning of an upper level aluminum interconnection layer, or a formation of through holes, a profile of the interlayer film adversely influences a patterning limit of a deposited resist for the lithography.

Here, a patterning characteristics of the resist in a region having steps will be explained with reference to FIG. 1, which is a sectional view of a resist layer deposited on a step portion.

The case of coating a resist film on a surface having a difference in altitude (stepped surface) and patterning the coated resist film, is different in two points from the case of coating and patterning a resist film on a flat surface. The first difference is that the thickness of the resist film varies in the vicinity of the stepped portion. The second difference is that an optimum focal depth of a stepper is different between a high altitude region and a low altitude region. Here, the focal depth is not a distance between a lens of the stepper and a local resist surface, but is a distance between the lens and a wafer (substrate).

Generally, the profile of the resist pattern is determined by an exposed image, an exposure intensity and an intensity of a reflected light from an underlying layer.

In the high altitude region, the patterned resist profile is determined by the exposed image and the exposure intensity. Particularly, a positive photoresist in a region having the altitude higher than a focal depth margin (the tolerance of the focal depth capable of patterning with an acceptable precision), it is a problem that the patterned resist profile is thinned by a spreading of the exposed image. A change in the exposure intensity is substantially negligible. On the other hand, in a region in the vicinity of the step, it is a problem that resolution is lowered by an increased thickness of the resist film, and the patterned resist profile is determined by the exposure intensity and the intensity of the reflected light from the underlying layer. Accordingly, the patterned resist profile is determined by different factors in the high altitude region and in the low altitude region in the vicinity of the step, respectively.

Next, explanation is turned to a conventional interlayer film formation process and the patterning of a resist used in the conventional interlayer film formation process. The conventional interlayer film formation process can be divided broadly into a local planarization process utilizing a flatness of a deposited film, and a global planarization process utilizing a technique other than the deposited film.

The local planarization process is generally exemplified by a resist etch-back process utilizing a coated resist film, and a SOG (Spin On Glass) process. By using these interlayer film planarization processes, local variation in thickness of the resist film can be suppressed, and therefore, the lowering of the focal depth margin attributable to variation in thickness of the resist can be suppressed. As a result, the local planarization process has been utilized in semiconductor devices in which the focal depth does not become a problem even if the pitch of the interconnection conductors is reduced and/or the thickness of the interconnection conductors is increased.

Referring to FIG. 2, there is shown a graph illustrating the dependency of a device maximum altitude difference and a resist focal depth margin for patterning a third level interconnection metal layer, to a minimum design size (pattern size) in a three-level interconnection metal structure.

The smaller the minimum design size (pattern size) becomes, the thinner the resist becomes, for the purpose of making it possible to realize a finer resist patterning. As a result, from the viewpoint of an etching precision and an anti-etching property of the resist, the interconnection layer has to be thinned in the three-level interconnection metal structure. Accordingly, the device maximum altitude difference correspondingly becomes small.

However, if because of reduction of the minimum design size (pattern size) the focal depth margin lowers below the device maximum altitude difference, it becomes impossible to simultaneously pattern the resist in the high altitude region and the resist in the low altitude region. On the other hand, the resist is actually required to have a thickness of 2.0 μm at minimum in order to ensure a thickness which can sufficiently proof against the etching of an interconnection conductor material. Accordingly, semiconductor devices having the minimum design size of not greater than 0.8 μm, at which the focal depth margin becomes lower than the device maximum altitude difference as the result of the reduction of the minimum design size (pattern size), cannot be realized if the global planarization process is not utilized.

The global interlayer film planarization technology includes a CMP (chemical mechanical polishing) process (R. R. Uttecht et al., "A FOUR-LEVEL-METAL FULLY PLANARIZED INTERCONNECT TECHNOLOGY FOR DENSE HIGH PERFORMANCE LOGIC AND SRAM APPLICATIONS", IEEE VMIC Conf. (Jun. 11–12, 1991), pages 20–26, 1991), a selective oxide film growth utilizing a CVD (chemical vapor deposition) (T. Homma et al., "A NEW INTERLAYER FORMATION TECHNOLOGY FOR COMPLETELY PLANARIZED MULTILEVEL INTERCONNECTION BY USING LPD", 1990 Symp. on VLSI Tech., pages 3–4, 1990), and a block resist process utilizing an inverted pattern resist of the underlying interconnection pattern (A. Schlitz et al., "Two-Layer Planarization Process", J. Electrochem. Soc.: SOLID STATE SCIENCE AND TECHNOLOGY, pages 178–181, January 1986; and Japanese Patent Application Laid-open No. JP-A-60-245229).

In particular, the block resist process is widely utilized since the global planarization can be realized while introducing no new apparatus into a manufacturing line (S. Fujii et al., "A Planarization Technology Using a Bias-Deposited Dielectric Film and an Etch-Back Process", IEEE Trans. on Electron Devices, Vol. 35, No. 11, pages 1829–1833, November 1988; D. J. Sheldon, et al., "Application of a Two-Layer Planarization Process to VLSI Intermetal Dielectric and Trench Isolation Processes", IEEE Trans. on Semiconductor Manufacturing, Vol. 1, No. 4, pages 140–146, November 1988; and S. R. Wilson et al., "HIGH PERFORMANCE, FOUR METAL LAYER INTERCONNECT SYSTEM FOR BIPOLAR AND BIMOS CIRCUITS", IEEE VMIC Conf.(June 12–13, 1990), pages 42–47, 1990).

Now, the block resist process will be explained with reference to FIGS. 3A to 3D.

First, an oxide film 4 is formed on a patterned metal layer 3 by use of a plasma CVD process, as shown in FIG. 3A. Then, a resist film 5 is deposited, and the deposited resist film 5 is patterned in a known lithographic process as shown in FIG. 3B, by using a negative or inverted mask of the mask pattern for the interconnection metal layer 3. Furthermore, a second resist film 7 is deposited on the whole surface to completely planarize the resist surface, as shown in FIG. 3C. Thereafter, an etch-back is performed by an anisotropic etching under the condition that the selective etching ratio of the resist to the oxide film is 1:1, so that a planarized interlayer film 4 is formed as shown in FIG. 3D.

Here, a pattern width of the patterned first resist film has to be smaller than that of an inverted pattern of the patterned interconnection layer. Referring to FIG. 4, there is shown a graph illustrating a relation between the flatness property of the post-planarization interlayer film and the space between the patterned interconnection layer and the patterned first resist film.

If the patterned first resist overlaps the patterned interconnection layer, the second resist overlaps the first resist in the vicinity of the patterned interconnection layer, and therefore, a block resist is formed in the vicinity of the patterned interconnection layer, with the result that when the etch-back process is performed, the oxide film is protected in the vicinity of the patterned interconnection layer so that a step is formed in the vicinity of the patterned interconnection layer. On the other hand, if the space between the patterned interconnection layer and the patterned first resist is too wide, after the second resist is coated, concaves are generated on the second resist layer, with the result that, after the etch-back process is performed, concaves are also formed in the etched-back interlayer film. This is ordinarily called a "bat wing". In other words, the resist profile is copied to the etched-back interlayer film.

Accordingly, the patterned first resist is required to be smaller than the interconnection pattern by a margin corresponding to the thickness of the interlayer film.

Incidentally, as an example of avoiding the margin between the interconnection pattern and the patterned first resist, the above referred Japanese Patent Application Laid-open No. JP-A-60-245229 proposed to isotropically etch the oxide film.

Referring to FIGS. 5A to 5C, there are illustrated the interlayer film planarization based on the block resist process utilizing the isotropic etching.

As shown in FIG. 5A, after an interlayer oxide film 4 is formed, a patterned resist layer 5 is formed on the oxide film 4 by use of an inverted mask of the mask for forming a patterned interconnection layer 3. Then, an isotropic etching is performed using a hydrofluoric acid by removing the interlayer oxide film 4 by a thickness (for example, 0.8 µm) which is smaller than the step difference, so that the steps on the interlayer oxide film 4 are removed as shown in FIG. 5B. Finally, the resist 5 is removed, so that the planarized interlayer film 4 is obtained as shown in FIG. 5C.

As seen from the above, the block resist process utilizing the anisotropic etching requires to prepare the inverted masks of the number corresponding to that of the interlayer films. In addition, since the margin between the mask for the patterned interconnection and its inverted mask depends upon the thickness of the interlayer film formed in the interlayer film formation process, a different mask is required for each interlayer film formation process. In this connection, since the mask for the patterned interconnection and its inverted mask for the first resist are used, a problem of misalignment inevitably occurs. Furthermore, since there is possibility that the block resist is not formed in the region of the margin between the mask for the patterned interconnection and its inverted mask for the first resist because of the restriction of the minimum size in the resist pattern, the flatness of the interlayer film is locally deteriorated.

In the block resist process utilizing the isotropic etching, on the other hand, another problem is encountered. Since the hydrofluoric acid widely used in the isotropic etching also etches aluminum of the interconnection conductor material, it is not possible to perform the isotropic etching a depth greater than the thickness of the oxide film. As a result, undulations is produced on the interlayer film, and therefore, when an upper level aluminum interconnection layer is patterned, the aluminum layer is not sufficiently removed due to variation in coverage of the upper level aluminum layer, so that a short-circuit is easy to occur between the patterned interconnections.

SUMMARY OF THE INVENTION

Accordingly, it is an object of the present invention to provide a process for forming a planarized surface, which is used in a process for manufacturing a semiconductor device having a multilevel interconnection structure, and which has overcome the above mentioned defects of the conventional ones.

Another object of the present invention is to provide a process for forming a completely planarized surface, without using the inverted mask of the mask for the underlying patterned interconnection layer, and with no fear of generation of the so-called "bat wing", and with a high yield of production.

The above and other objects of the present invention are achieved in accordance with the present invention by a process for manufacturing a semiconductor device, including:

the step of selectively forming interconnections on an insulating film formed on a semiconductor substrate and depositing, on a surface including the interconnections, an interlayer insulating film having a thickness thicker than that of the interconnections;

the step of depositing a first resist of a positive type photoresist on the interlayer insulating film, and exposing a whole of the deposited first resist, through a mask having a regular pattern extending over the whole of the mask, while causing an exposing light to be focused on a low altitude region portion of the interlayer insulating film, and then, developing the first resist so that a regular pattern of the first resist is formed on only the low altitude region of the interlayer insulating film;

the step of depositing a second resist on a surface including the first resist so as to cause the second resist to have a substantially planarized surface; and the step of performing an etch-back for a whole surface at least until a surface of the interlayer insulating film in the low altitude region is exposed, whereby an upper surface of the interlayer insulating film is planarized.

According to another aspect of the present invention, there is provided a process for manufacturing a semiconductor device, including:

the step of selectively forming interconnections on an insulating film formed on a semiconductor substrate and depositing, on a surface including the interconnections, an interlayer insulating film having a thickness thinner than that of the interconnections;

the step of depositing a photosensitive polyimide on the interlayer insulating film, and exposing a whole of the deposited photosensitive polyimide, through a mask having a regular pattern extending over the whole of the mask, while causing an exposing light to be focused on a low altitude region portion of the interlayer insulating film, and then, developing the photosensitive polyimide so that a regular pattern of the photosensitive polyimide is formed on only the low altitude region of the interlayer insulating film; and the step of depositing a second polyimide on a surface including the photosensitive polyimide so as to cause the second photosensitive polyimide to have a substantially planarized surface.

As seen from the above, the present invention is characterized in that the photosensitive resin is exposed by causing the exposing light to focus on only a low altitude region portion of the photosensitive resin deposited on the low altitude region of the interlayer insulating film, by utilizing the fact that, in the process of the photoresist film exposing process, the focal depth is substantially equal to a difference in altitude between a high altitude region and a low altitude region of the interlayer insulating film. As a result, the exposed photosensitive resin remains on only the low altitude region of the interlayer insulating film in a self-alignment manner, and the interlayer film is planarized by utilizing the photosensitive resin remaining on only the low altitude region of the interlayer insulating film.

Now, a method for selectively forming a resist on a low altitude region will be explained with reference to FIG. 6, which is a graph illustrating a focus offset dependency of the resist pattern size, in the case of patterning a resist film of 3.0 μm thickness formed on a wafer surface having a step difference of 3.0 μm.

As will be seen from the graph of FIG. 6, the characteristics curve of the resist pattern size in the high altitude region is displaced towards the lens side by about 2 μm, in comparison with the characteristics curve of the resist pattern size in the low altitude region.

If the focus offset is −2.0 μm, the exposing light is focused on the resist formed in the high altitude region, and therefore, the resist pattern is formed on the high altitude region. On the other hand, if the focus offset is 0 μm, the exposing light is focused in the resist formed on the low altitude region, and therefore, the resist deposited on the low altitude region is patterned. But, in the high altitude region, since the exposing light is spread, the resist film is thinned out, with the result that the resist does not remain in the high altitude region. Namely, the resist pattern is not formed in the high altitude region.

Here, a resist forming condition for selectively forming the resist on the low altitude region is determined by the size of the mask pattern, the focus offset, the resist film thickness, and the exposing light amount.

Referring to FIG. 7, there is shown a graph illustrating the relation between the focus offset, the mask pattern size (line width and space in a line-and-space pattern) and the interconnection thickness (step difference) in the case of using a regular stripe (line-and-space) pattern mask. As seen from FIG. 7, in the case that the interconnection step (interconnection conductor thickness) is 1.0 μm, if the mask pattern size (width and space) of 1.0 μm is used, the resist pattern can be selectively formed on the low altitude region by setting the focus offset to 1.5 μm. Alternatively, in the case that the interconnection step is 3.0 μm, if the mask pattern size of 2.0 μm is used, the resist pattern can be selectively formed on the low altitude region by setting the focus offset to 2.0 μm. Here, since the focal depth margin becomes small with increase of the exposure amount, the resist film thickness is preferred to be not greater than 5 μm. On the other hand, the exposure amount is preferably on the degree permitting to expose, with a sufficient high resolution, a thick resist portion inevitably formed in the vicinity of step edges.

The above and other objects, features and advantages of the present invention will be apparent from the following description of preferred embodiments of the invention with reference to the accompanying drawings.

DESCRIPTION OF THE PREFERRED EMBODIMENTS

Referring to FIGS. 8A to 8E, there are shown sectional views illustrating a first embodiment of the process in accordance with the present invention for forming an interlayer insulating film having a completely planarized upper surface, by forming a first resist patterned through a stripe pattern (line-and-space pattern) and a second resist covering a surface including the first resist, and then, performing the resist etching-back.

Figure 1:
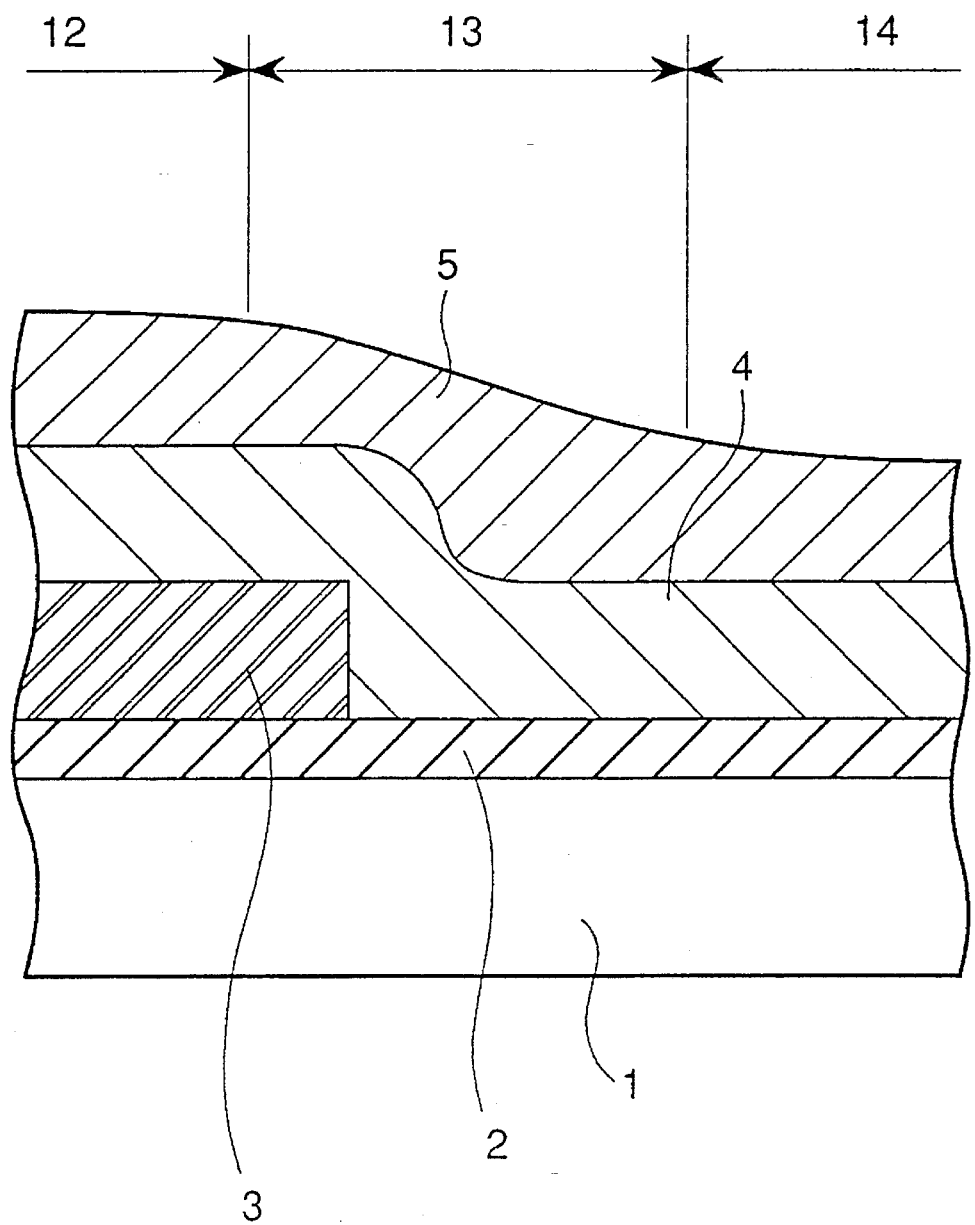
FIG. 1 is a sectional view of a resist layer deposited on a step portion.
Figure 2:
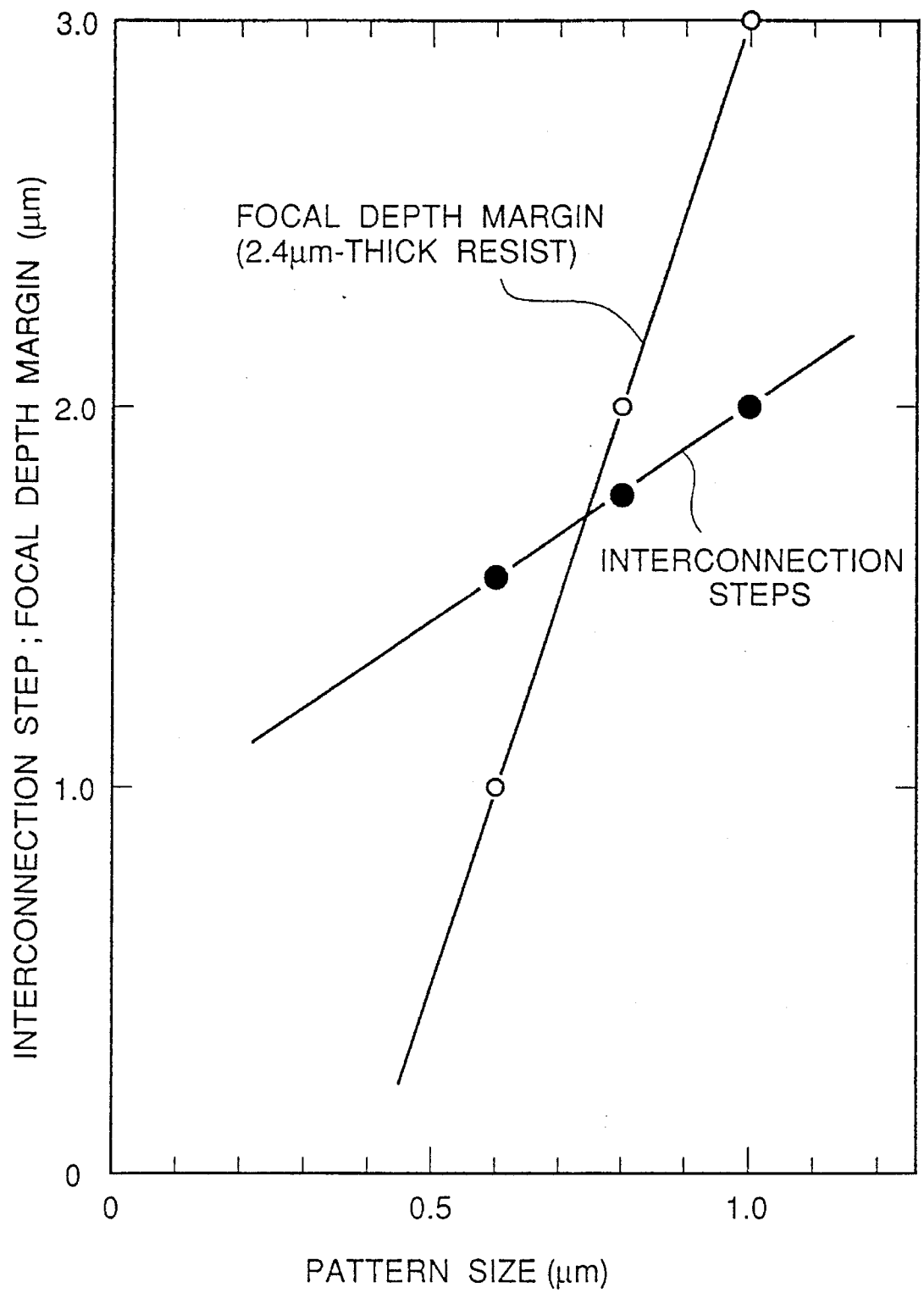
FIG. 2 is a graph illustrating the relation between the device maximum altitude difference, the resist focal depth margin for patterning a third level interconnection metal layer, and the minimum design size (pattern size), in a three-level interconnection metal structure.
Figure 3A:
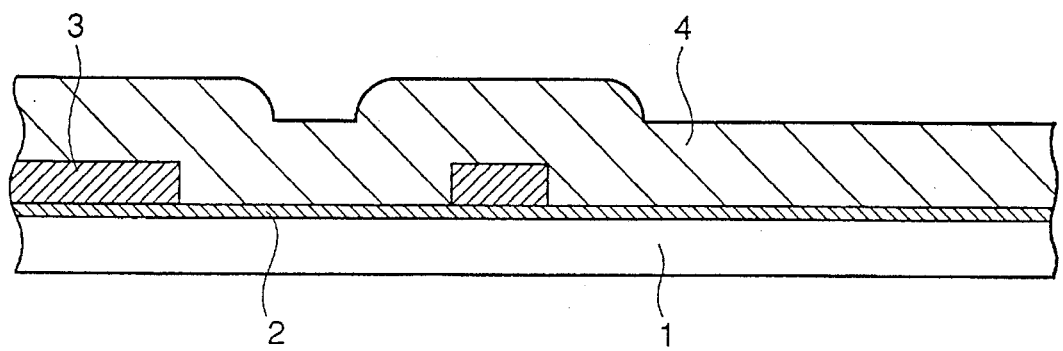
FIGS. 3A to 3D are sectional views illustrating the interlayer film planarization based on the block resist process utilizing the anisotropic etching.
Figure 3B:
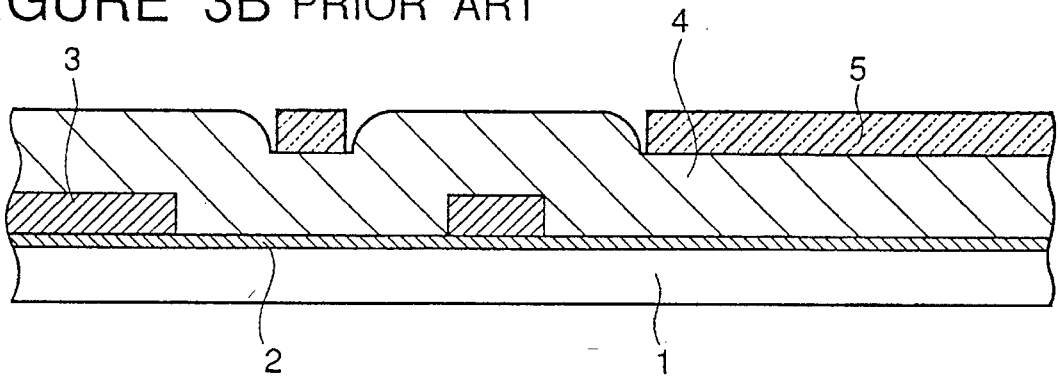
Figure 3C:
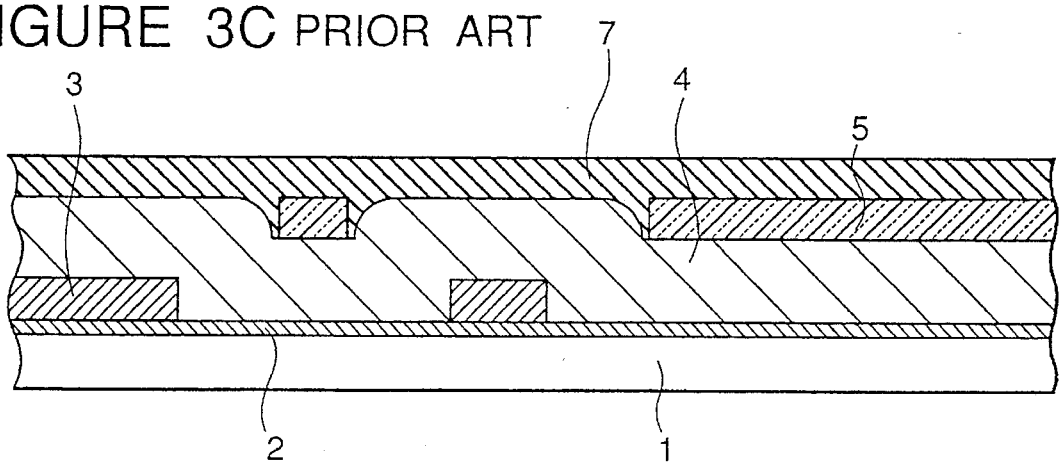
Figure 3D:
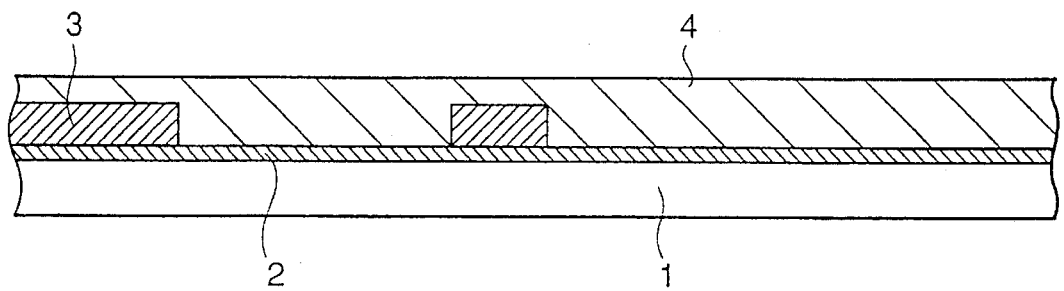
Figure 4:
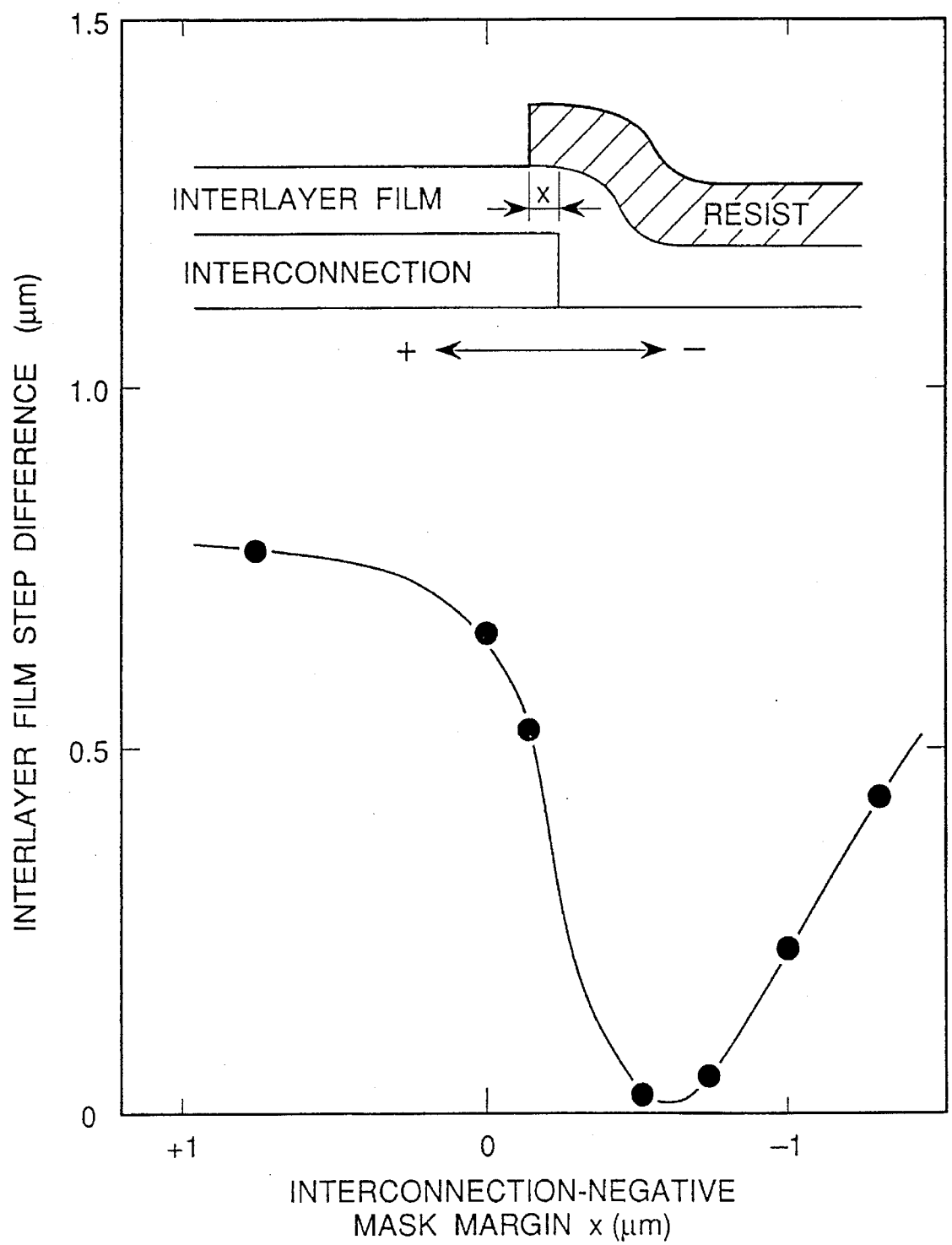
FIG. 4 is a graph illustrating a relation between the flatness property of the post-planarization interlayer film and the space between the patterned interconnection layer and the patterned first resist.
Figure 5A:
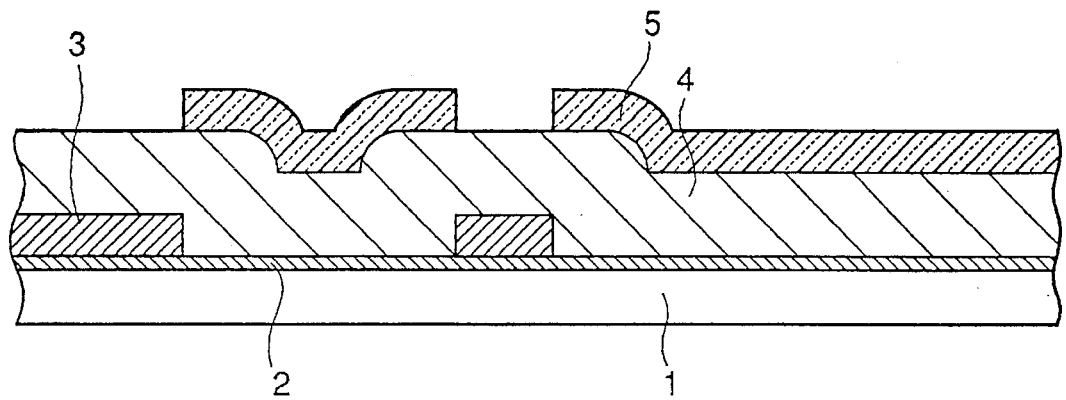
FIGS. 5A to 5C are sectional views illustrating the interlayer film planarization based on the block resist process utilizing the isotropic etching.
Figure 5B:
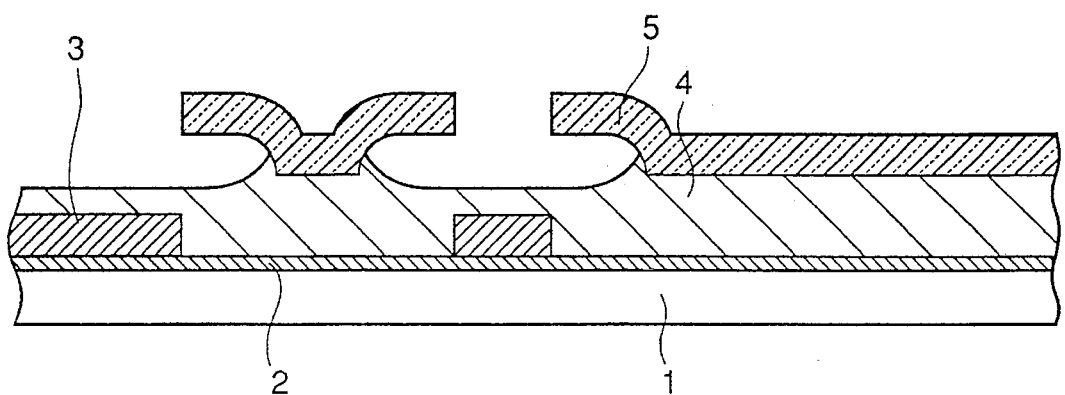
Figure 5C:
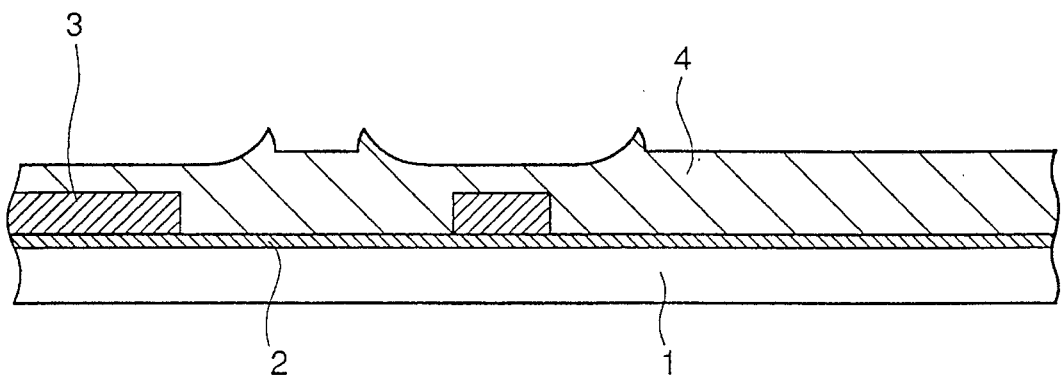
Figure 6:
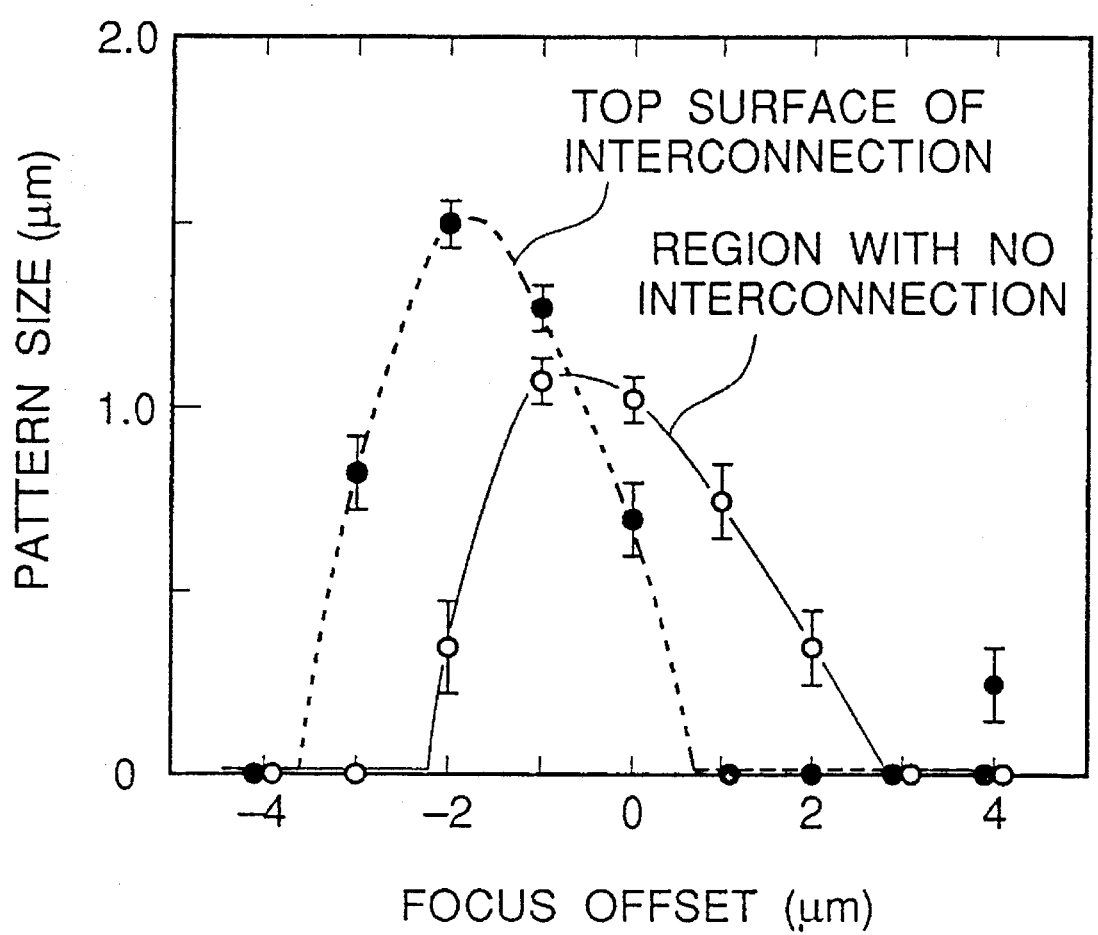
FIG. 6 is a graph illustrating a focus offset dependency of the resist pattern size, in the case of patterning a resist film of 3.0 μm thickness formed on a wafer surface having a step difference of 3.0 μm.
Figure 7:
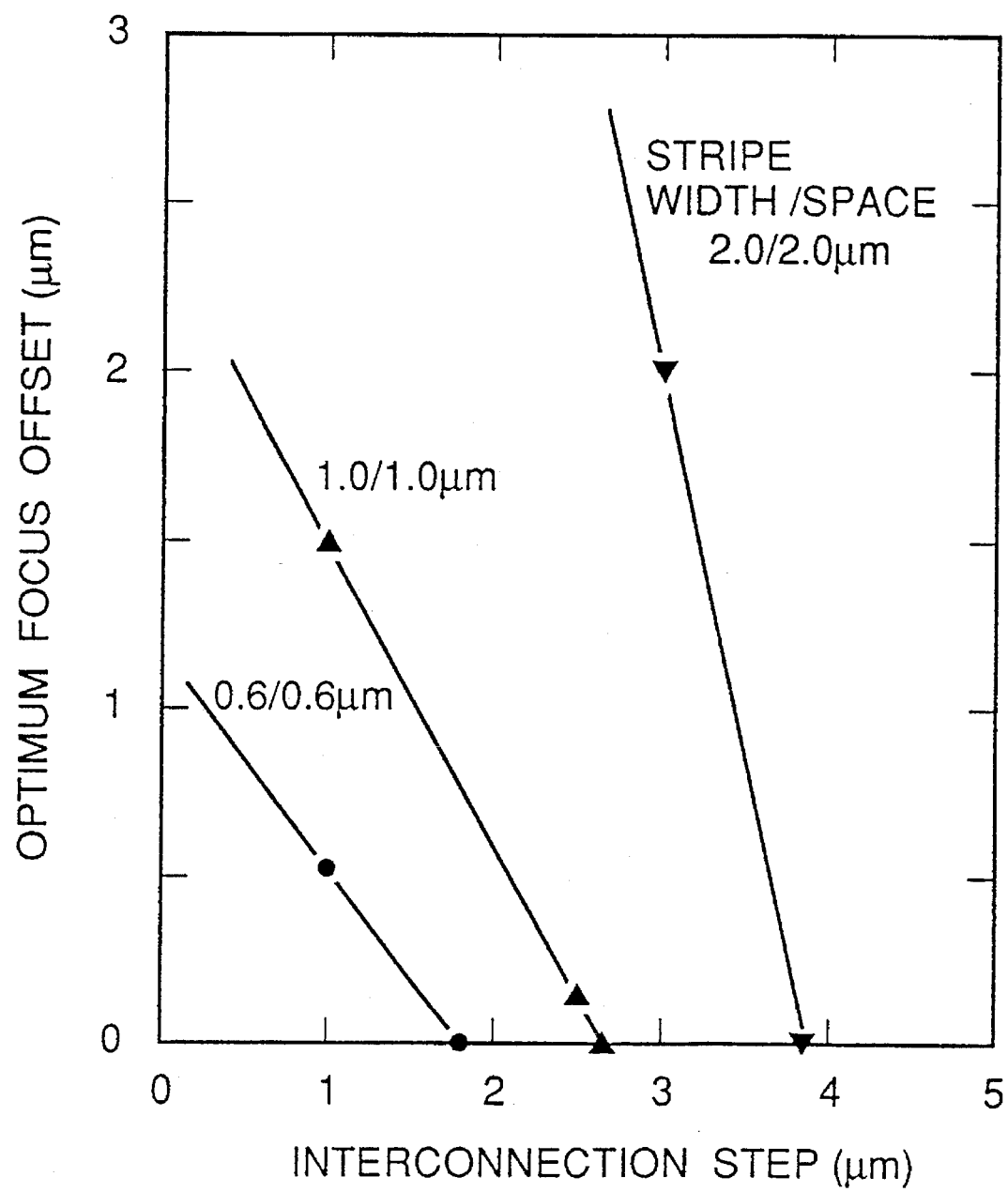
FIG. 7 is a graph illustrating the relation between the focus offset, the mask pattern size (width and space) and the interconnection thickness in the case of using a regular stripe pattern mask.
Figure 8A:
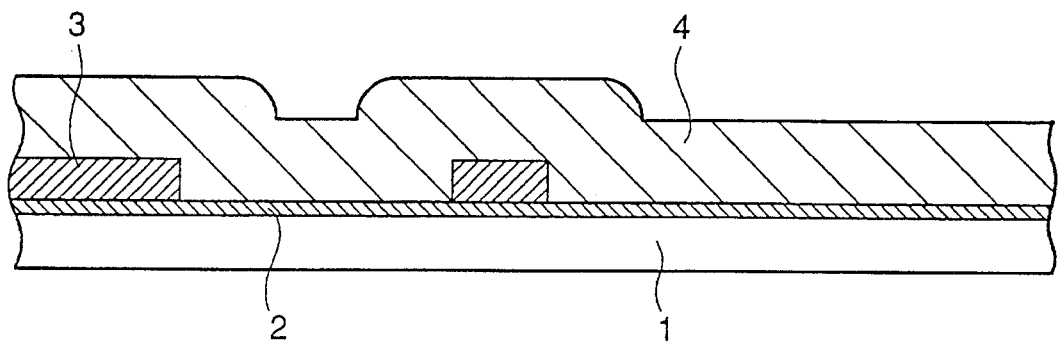
FIGS. 8A to 8E are sectional views illustrating a first embodiment of the process in accordance with the present invention for forming an interlayer insulating film having a completely planarized upper surface.

First, as shown in FIG. 8A, after interconnections 3 formed by depositing a metal film such as an aluminum film of 1 μm thickness on an oxide silicon film 2 formed on a surface of a silicon substrate 1 and then by patterning the deposited metal film, an oxide film 4 is formed to cover a whole surface including the interconnections 3, by use of a plasma oxidized film growth process. The oxide film 4 has a thickness larger than that of the interconnections 3. For example, the oxide film 4 has the thickness of 2 μm.

Figure 8B:
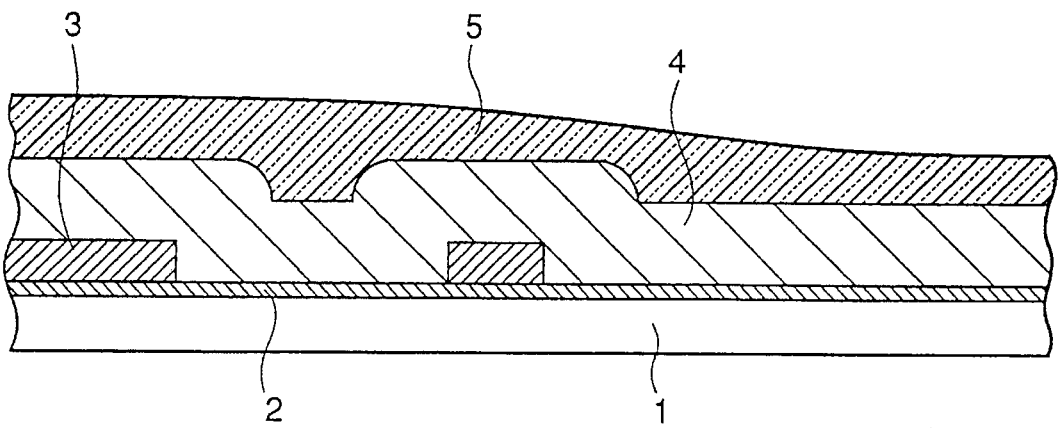

Then, as shown in FIG. 8B, a positive photoresist layer 5 is deposited to cover the whole surface of the oxide film 4. A thickness of the photoresist layer 5 is larger than that of the interconnections 3. For example, the thickness of the photoresist layer 5 is 3 μm.

Figure 8C:
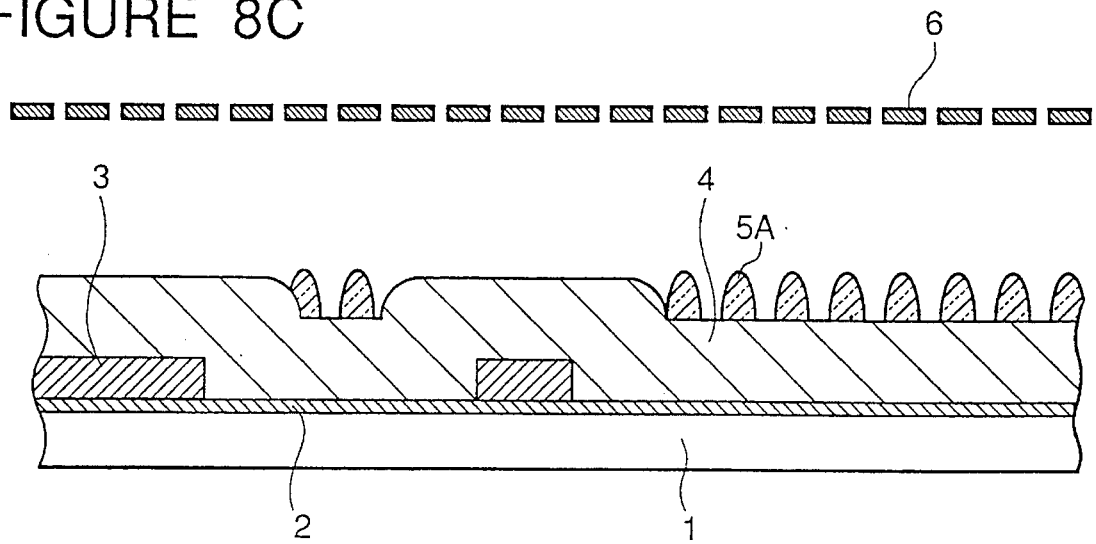

Furthermore, as shown in FIG. 8C, by using a mask 6 having a regular stripe pattern (line-and-space pattern) extending over the whole of the mask and having a constant line width of 1 μm and a constant space (opening) width of 1 μm, and also by adjusting a focus of a stepper to be positioned on a low altitude region (in which no interconnection is provided), the deposited photoresist layer 5 is exposed with 300 mJ/cm$^{-2}$, and then developed so as to form on the low altitude region a resist pattern 5A in the form of a stripe pattern (line-and-space pattern) in a self alignment manner.

Figure 8D:
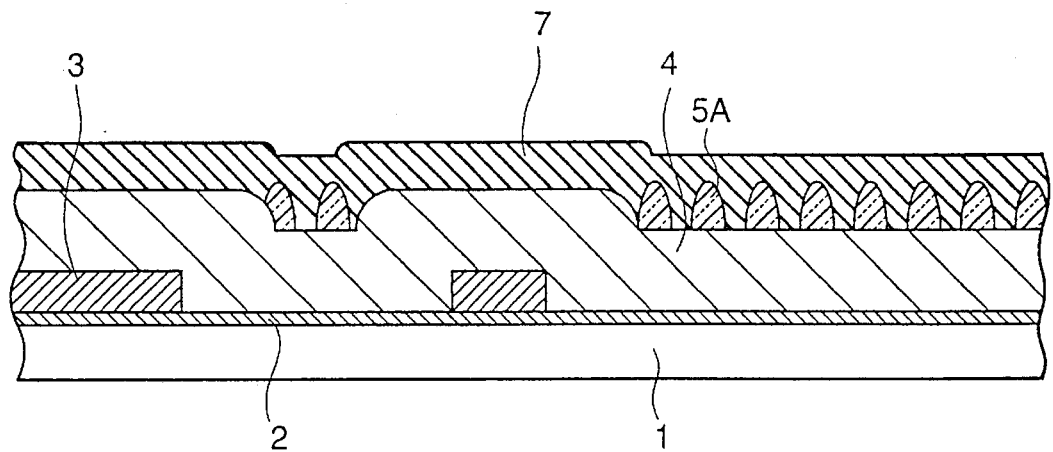

Thereafter, as shown in FIG. 8D, a second resist layer 7 of for example 2 μm thickness is deposited on the surface including the resist pattern 5A so as to fill spaces between parallel lines of the resist pattern 5A, to completely cover the resist pattern 5A and to have a substantially flat upper surface.

Figure 9:
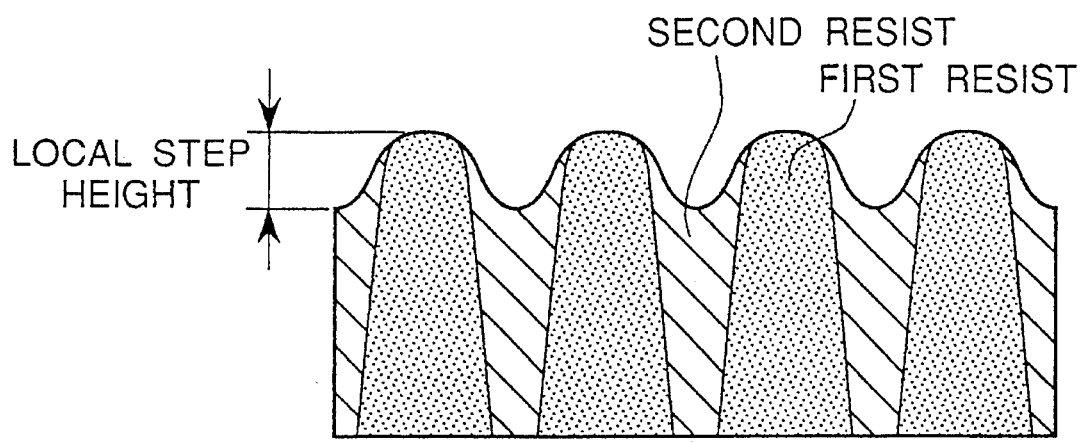
FIG. 9 is a graph illustrating the relation between the local step height on the resist surface and the thickness of the second resist film.
Figure 9:
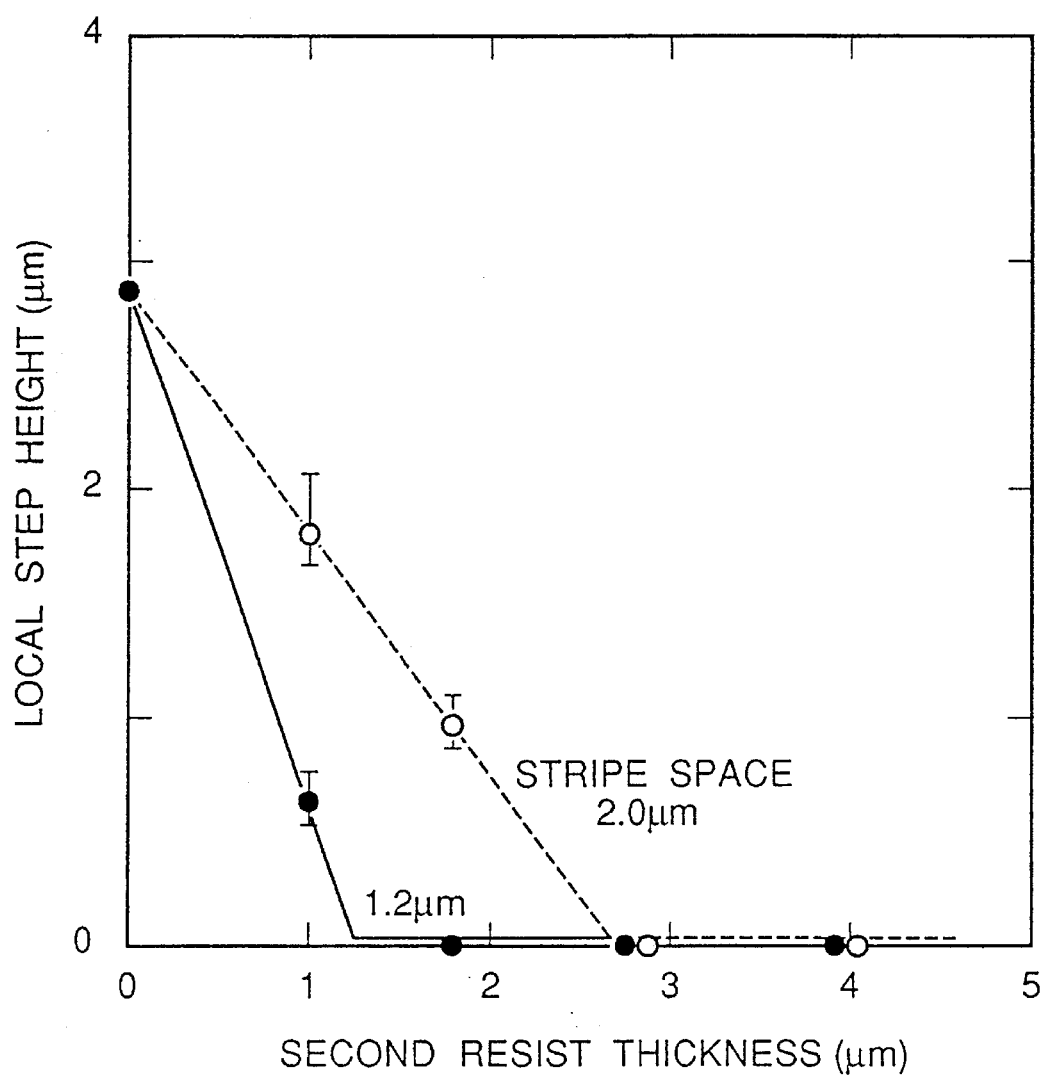

Here, reference is made to FIG. 9 which is a graph illustrating the relation between the height of local steps remaining on the second resist film surface and the thickness of the second resist film. The narrower the space between the lines of the stripe pattern becomes in comparison with the width of the lines of the stripe pattern, the total volume of the spaces in the first resist pattern to be filled with the second resist becomes small, and the space filling property becomes high. As a result, the flatness, after the interlayer film is planarized, becomes excellent. Accordingly, it is preferred in the patterned resist layer 5A that the space between the lines (unitary patterns) in the stripe pattern is smaller than the width of the lines of the stripe pattern.

Figure 8E:
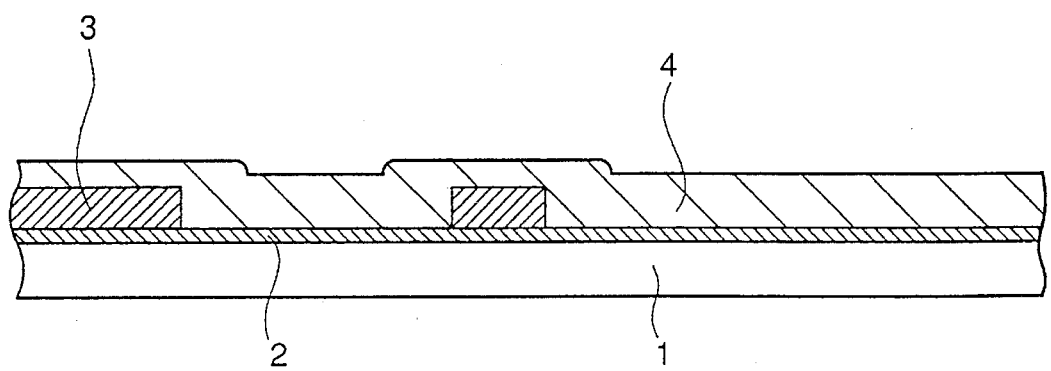

Thereafter, as shown in FIG. 8E, an etch-back is performed by using $CF_4$ and oxygen under the etching condition that the selective etching ratio of the resist to the oxide film is 1:1, until the oxide film 4 is exposed in its whole surface. As a result, a planarized interlayer film 4 can be obtained.

Figure 10A:
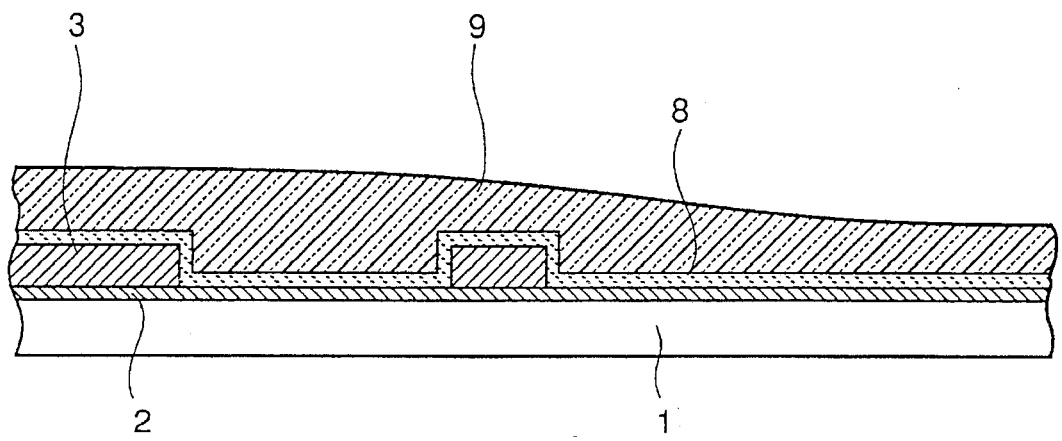
FIGS. 10A to 10C are sectional views illustrating a second embodiment of the process in accordance with the present invention for forming an interlayer insulating film having a completely planarized upper surface.
Figure 10B:
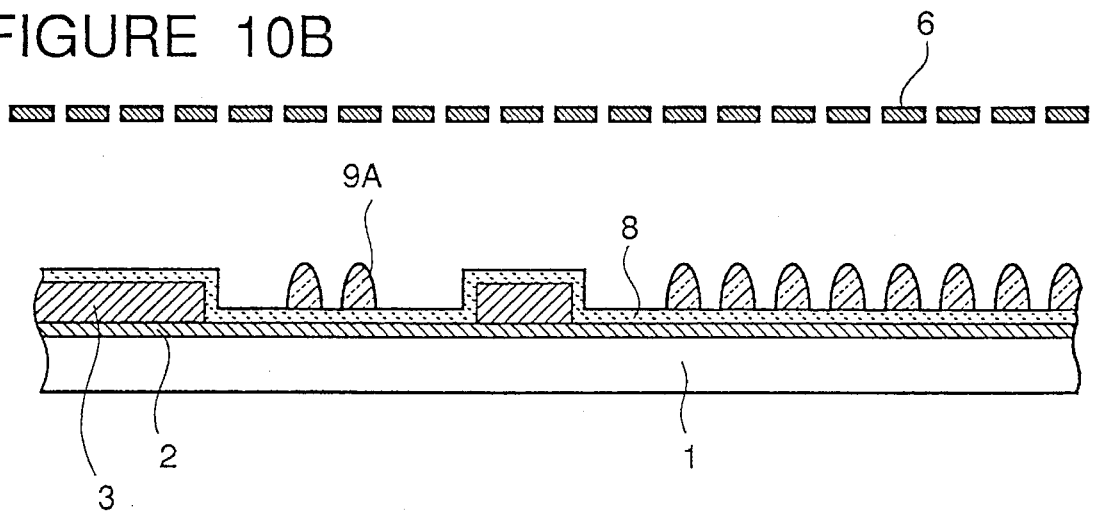
Figure 10C:
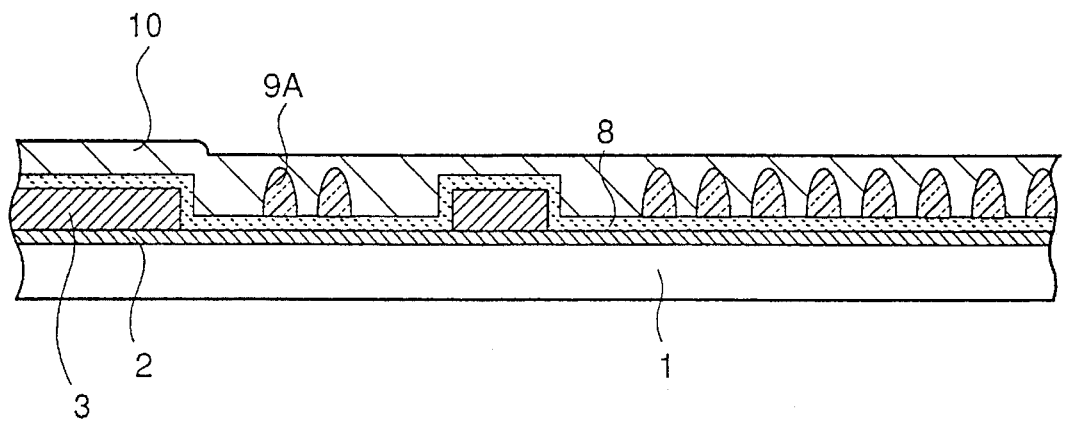

Referring to FIGS. 10A to 10C, there are shown sectional views illustrating a second embodiment of the process in accordance with the present invention for forming an interlayer insulating film having a completely planarized upper surface. This second embodiment is characterized in that the step of etching back the resist and the oxide film in the first embodiment is omitted by using a photosensitive polyimide film in place of the photoresist.

As shown in FIG. 10A, to improve a bonding property between polyimide and the interconnection material, a nitride film 8 of 100 nm in thickness is coated to cover the whole surface of the interconnections 3 and the oxide film 2 which are formed similarly to the first embodiment. Thereafter, a photosensitive polyimide layer 9 of 2.0 μm in thickness is coated to cover a whole surface of the nitride film 8.

Then, as shown in FIG. 10B, by using a mask 6 having a regular stripe pattern (line-and-space pattern) of 1 μm-line-width and 1 μm-space-width extending over the whole of the mask, and also by adjusting a focus of a stepper to be positioned on a low altitude region, the deposited photosensitive polyimide layer 9 is exposed with 300 mJ/cm$^{-2}$, so that a polyimide pattern 9A in the form of a stripe pattern (line-and-space pattern) is formed in a self-alignment manner on the low altitude region where no interconnection 3 is provided.

After a heat treatment is carried out at a temperature of 300° C. so as to vaporize moisture, a second polyimide layer 10 of 2.0 μm in thickness is coated to cover the whole surface, and a heat treatment is carried out at a temperature of 300° C., again. As a result, a planarized interlayer film (composed of the polyimide pattern 9A and the second polyimide layer 10) is formed as shown in FIG. 10C.

Figure 11A:
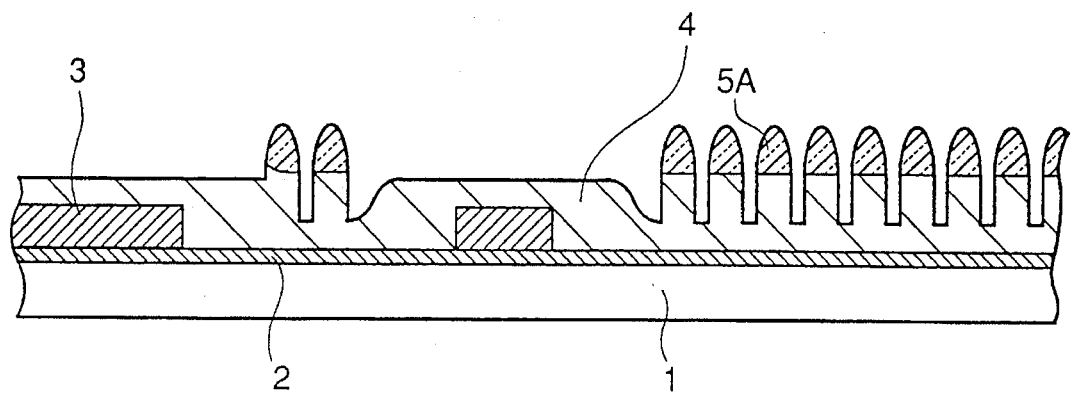
FIGS. 11A to 11C are sectional views illustrating a third embodiment of the process in accordance with the present invention for forming an interlayer insulating film having a completely planarized upper surface.
Figure 11B:
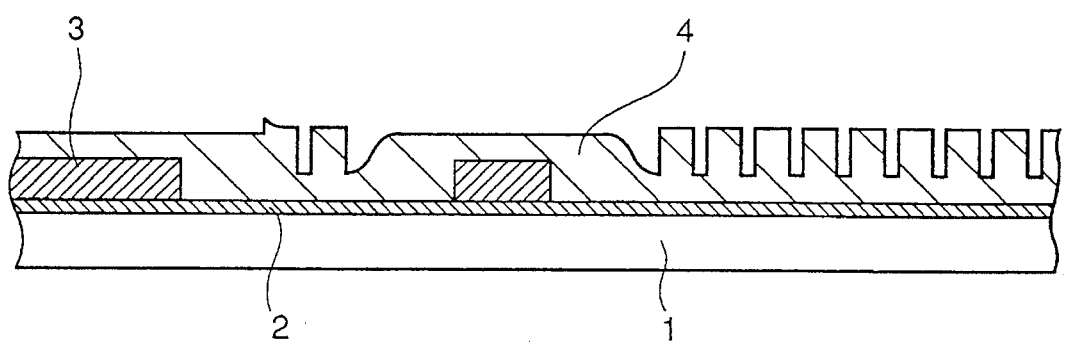
Figure 11C:
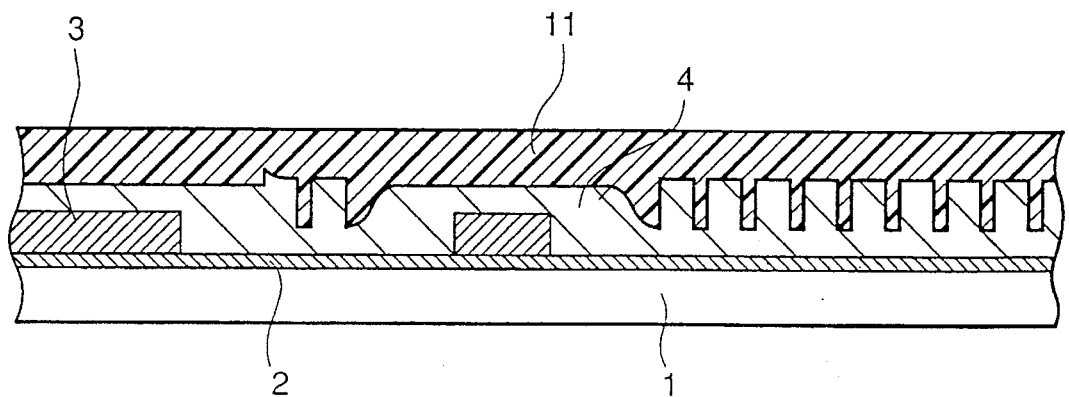

Referring to FIGS. 11A to 11C, there are shown sectional views illustrating a third embodiment of the process in accordance with the present invention for forming an interlayer insulating film having a completely planarized upper surface.

This third embodiment is characterized in that the oxide film is etched back using the patterned resist and the etched-back oxide film is coated with a second oxide film which is formed by an atmosphere pressure CVD (chemical vapor deposition) process using oxygen containing ozone ($O_3$) and tetraethoxysilane ($Si(OC_2H_5)_4$, called "TEOS" hereinafter) as a source gas, for the purpose of avoid deterioration of the flatness caused by variation in thickness of a deposited film (which is an inherent problem in a deposited film) so that an interlayer film having an in-plane evenness can be formed.

After the steps shown in FIGS. 8A to 8C are completed, the oxide film 4 is etched using the resist pattern 5A as a mask, by a thickness (on the order of 1.0 μm) corresponding to the altitude difference (the interconnection thickness), as shown in FIG. 11A.

Thereafter, the resist pattern 5A is removed by a plasma processing in an oxygen atmosphere, as shown in FIG. 11B.

Then, an oxide film 11 having a thickness of about 600 nm is formed to cover the whole surface of the oxide film 4, by the atmosphere pressure CVD process using the $O_3$/TEOS containing oxygen as a source gas, so that the steps are completely covered and the interlayer film having a completely planarized surface is formed as shown in FIG. 11C.

Figure 12A:
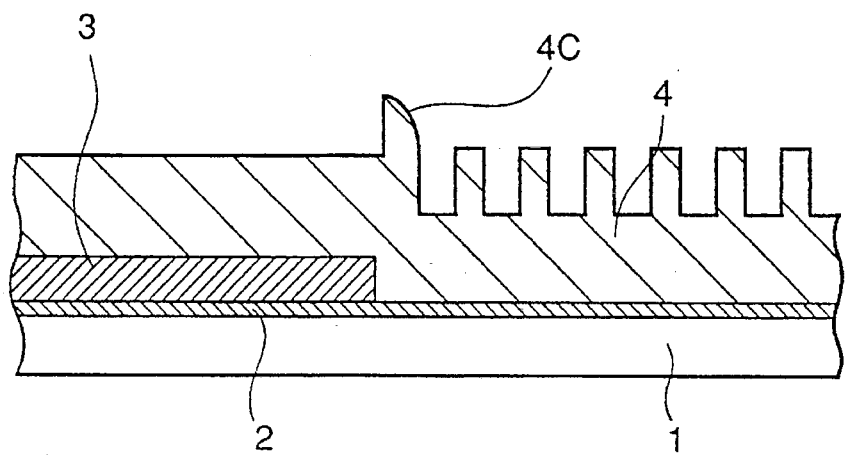
FIGS. 12A to 12C are sectional views illustrating a fourth embodiment of the process in accordance with the present invention for forming an interlayer insulating film having a completely planarized upper surface.
Figure 12B:
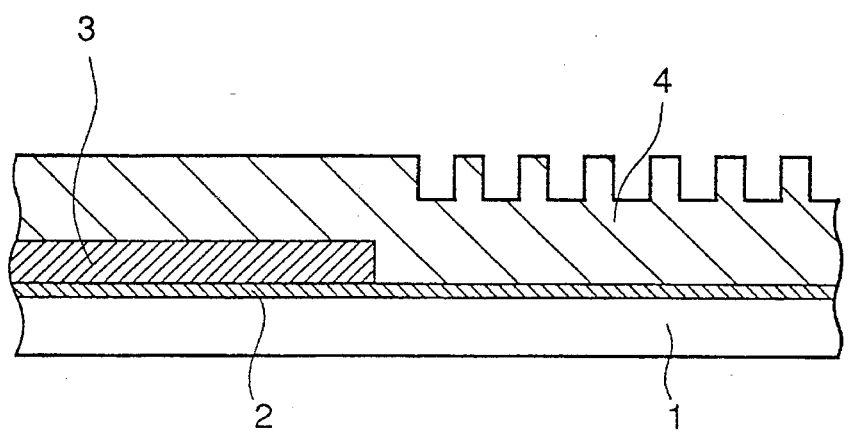
Figure 12C:
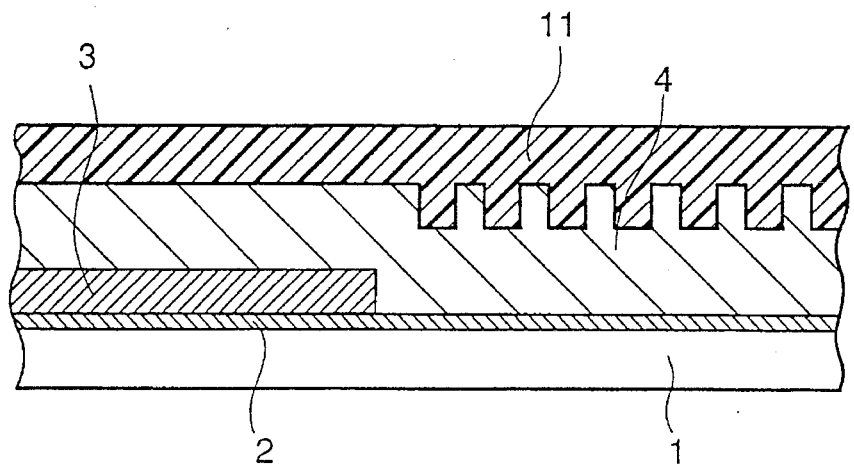

Referring to FIGS. 12A to 12C, there are shown sectional views illustrating a fourth embodiment of the process in accordance with the present invention for forming an interlayer insulating film having a completely planarized upper surface.

Figure 13:
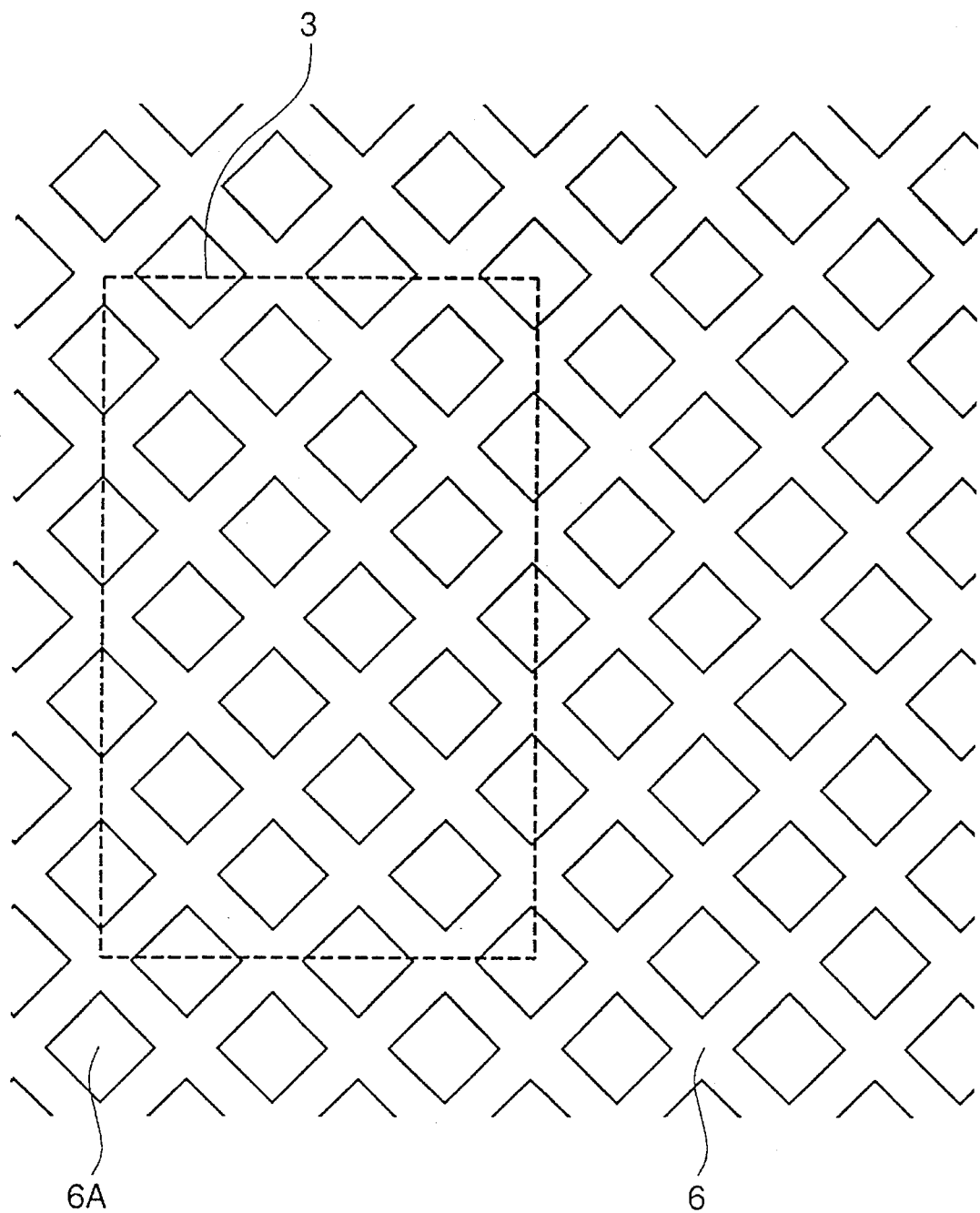
FIG. 13 illustrates a positional relation between the interconnection pattern and the mask pattern when the exposure is performed by using a grille like mask pattern.

In this fourth embodiment, in place of the stripe mask pattern (line-and-space pattern), there is used a grille mask pattern having a mask pattern contour line or outline inclined by 45° to a contour line or outline of the interconnections as shown in FIG. 13, which illustrates a positional relation between the interconnection pattern and the mask pattern when the exposure is performed by using the grille mask pattern.

Before the fourth embodiment is described, explanation will be made on a problem encountered when the lines and spaces of the regular stripe pattern are in parallel to the contour line or outline of the interconnections, with reference to FIGS. 14A to 14E, which are sectional views illustrating that a local step is generated when a regular stripe pattern is in parallel to the periphery of the interconnections. Thereafter, the fourth embodiment configured to overcome the problem will be explained with reference to FIGS. 12A to 12C.

When the lines and spaces of the regular stripe pattern are in parallel to the contour line or outline of the interconnections, it is in some cases that a local step is formed on the oxide film at a position of the contour line or outline of the interconnections, and therefore, the surface flatness is deteriorated. This situation will be explained in an example in which the interlayer film forming and planarizing process is performed by the oxide film etch-back process in accordance with the present invention.

Figure 14A:
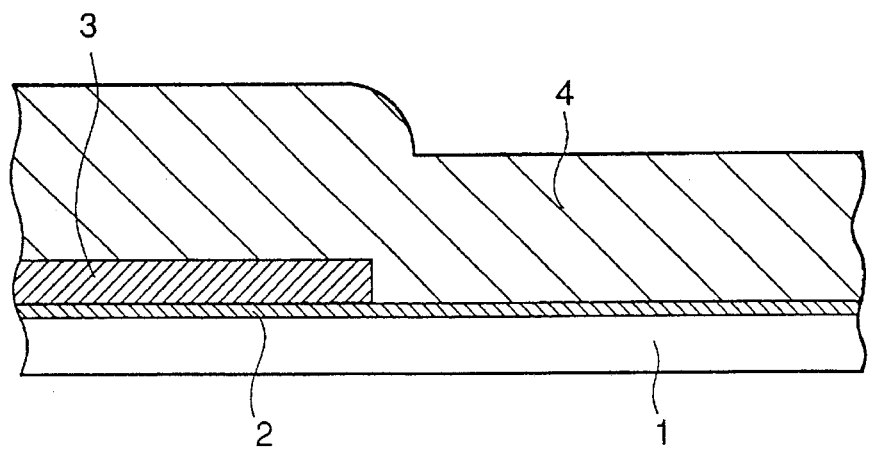
FIGS. 14A to 14E are sectional views illustrating that a local step is generated when a regular resist pattern is in parallel to the periphery of the interconnections.

As shown in FIGS. 14A, after the interconnection 3 of 1.0 μm thickness is formed on the oxide film 2 formed on the substrate 1, an oxide film 4 is formed to cover a whole surface including the interconnection 3, by use of a plasma oxidized film growth process, so as to have a thickness which is larger than that of the interconnections 3, and which is for example 2 μm.

Then, a positive photoresist layer having a thickness larger than that of the interconnections 3, for example, the thickness of is 3 μm, is deposited to cover the whole surface of the oxide film 4. Thereafter, by using a mask (not shown in FIG. 14B) having a regular line-and-space pattern of a 1 μm-line-width and 1 μm-space-width extending over the whole of the mask, and also by adjusting a focus of a stepper to be positioned on a low altitude region, the deposited photoresist layer is exposed with 300 mJ/cm$^{-2}$, and then developed so as to form on the low altitude region a resist pattern 5A in the form of a line-and-space pattern, as shown in FIG. 14B.

Figure 14B:
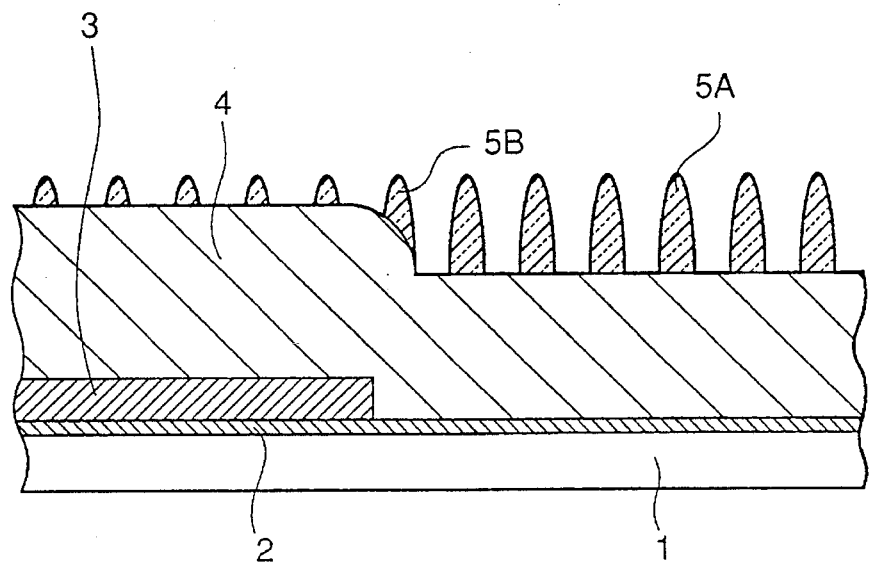
Figure 14C:
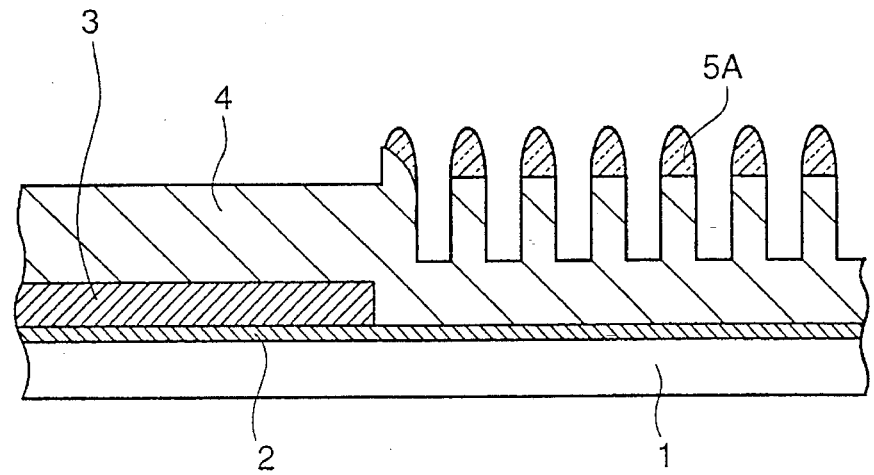
Figure 14D:
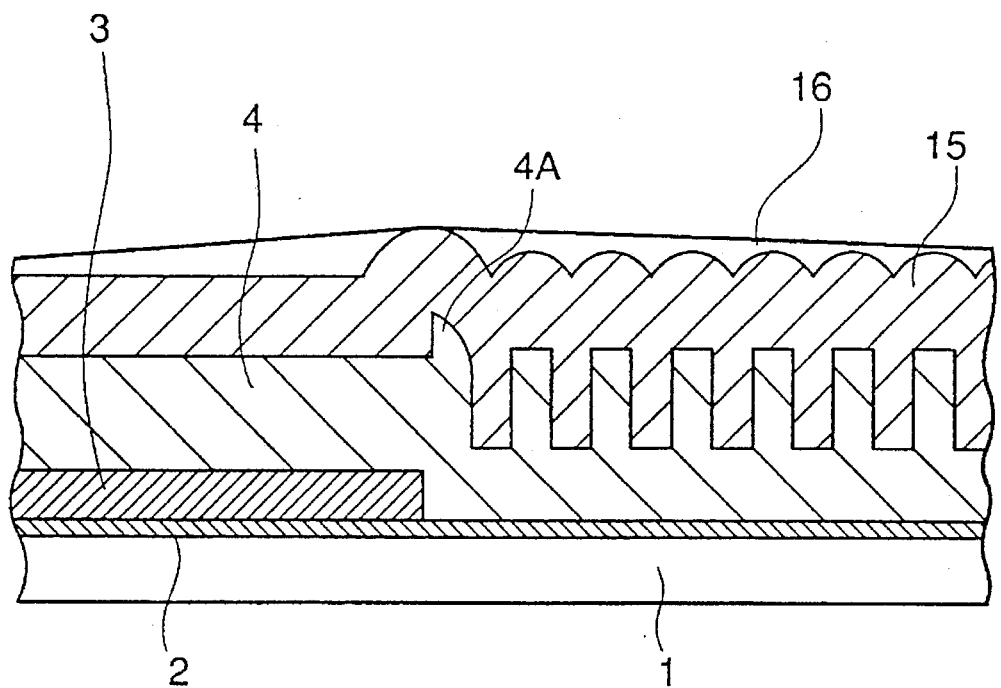

Furthermore, as shown in FIG. 14C, the oxide film 4 is etched using the resist pattern 5A as a mask, by a thickness (on the order of 1.0 μm) corresponding to the altitude difference (the interconnection thickness). Thereafter, the resist pattern 5A is removed, and a second plasma oxidized film 15 is formed on the whole of the exposed oxide film 4, and furthermore, an overcoating film 16 such as a SOG film on the order of 0.5 μm thickness is coated on the whole of the second plasma oxidized film 15, as shown in FIG. 14D.

Figure 14E:
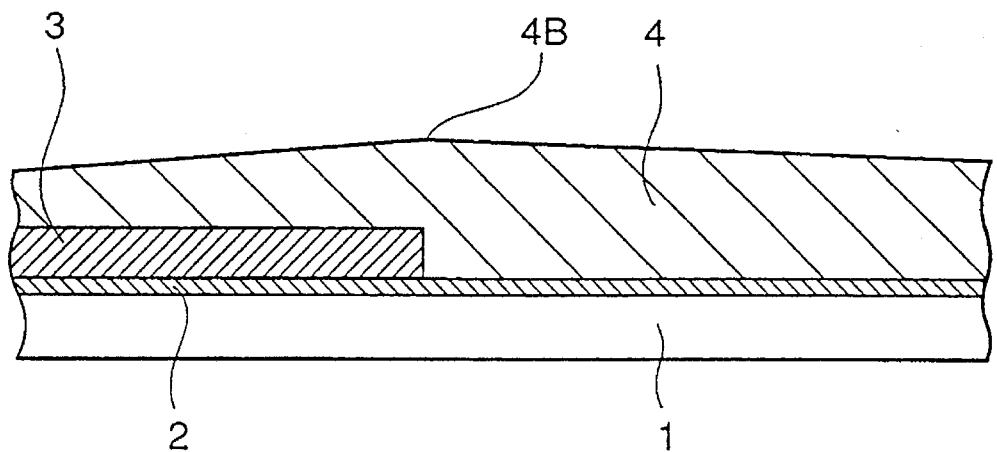

Then, the whole surface is etched back on the order of 3.01 μm thickness, so that a planarized interlayer oxide film is formed as shown in FIG. 14E.

In the above mentioned process, if a resist pattern 5B remains on an edge of the high altitude portion of the oxide film 4 as shown in FIG. 14B, the remaining resist pattern 5B extends along and in parallel to the contour line or outline of the interconnection 3. This elongated remaining resist pattern 5B results in an elongated rib or wall 4A of the oxide film 4 remaining after the remaining resist pattern 5B is removed, as shown in FIG. 14D. The elongated rib or wall 4A also extends along and in parallel to the contour line or outline of the interconnection 3, and finally produces an elongated step or projection 4B on the planarized interlayer oxide film 4, as shown in FIG. 14E.

In order to overcome the above mentioned problem, a grille mask pattern having the pattern contour line or outline inclined by 45° to the contour line or outline of the interconnections as shown in FIG. 13, is used, and the CMP process of the oxide film etching is used.

After the steps shown in FIGS. 14A to 14C are completed, the remaining resist pattern 5A is removed as shown in FIG. 12A, and the CMP process is performed as to remove the remaining projections 4C of the oxide film 4 shown in FIG. 12A (remaining along the contour line or outline of the interconnection 3), as shown in FIG. 12B.

In this embodiment, as mentioned above, since there is used the grille mask pattern having the pattern contour line or outline inclined to the contour line or outline of the interconnections by a substantial angle of for example by 45° as shown in FIG. 13, the mask pattern contour line or outline becomes positionally consistent with the contour line or outline of the interconnections, only in a greatly reduced area, specifically, only in discrete or separate small spot areas. Accordingly, the projections 4C are hard to remain, and even if the projections 4C remain, the remaining projections 4C are different from the elongated rib or wall 4A extending along and in parallel to the contour line or outline of the interconnection 3. Rather, the remaining projections 4C can be said to be pin-like projections. Accordingly, the remaining projections 4C can easily removed in the CMP process.

Thereafter, as shown in FIG. 12C, an oxide film 11 having a thickness of about 600 nm is formed to cover the whole surface of the oxide film 4, by the atmosphere pressure CVD process using the $O_3$/TEOS containing oxygen as a source gas, so that the steps are completely covered and the interlayer film having a completely planarized surface is formed.

Figure 15:
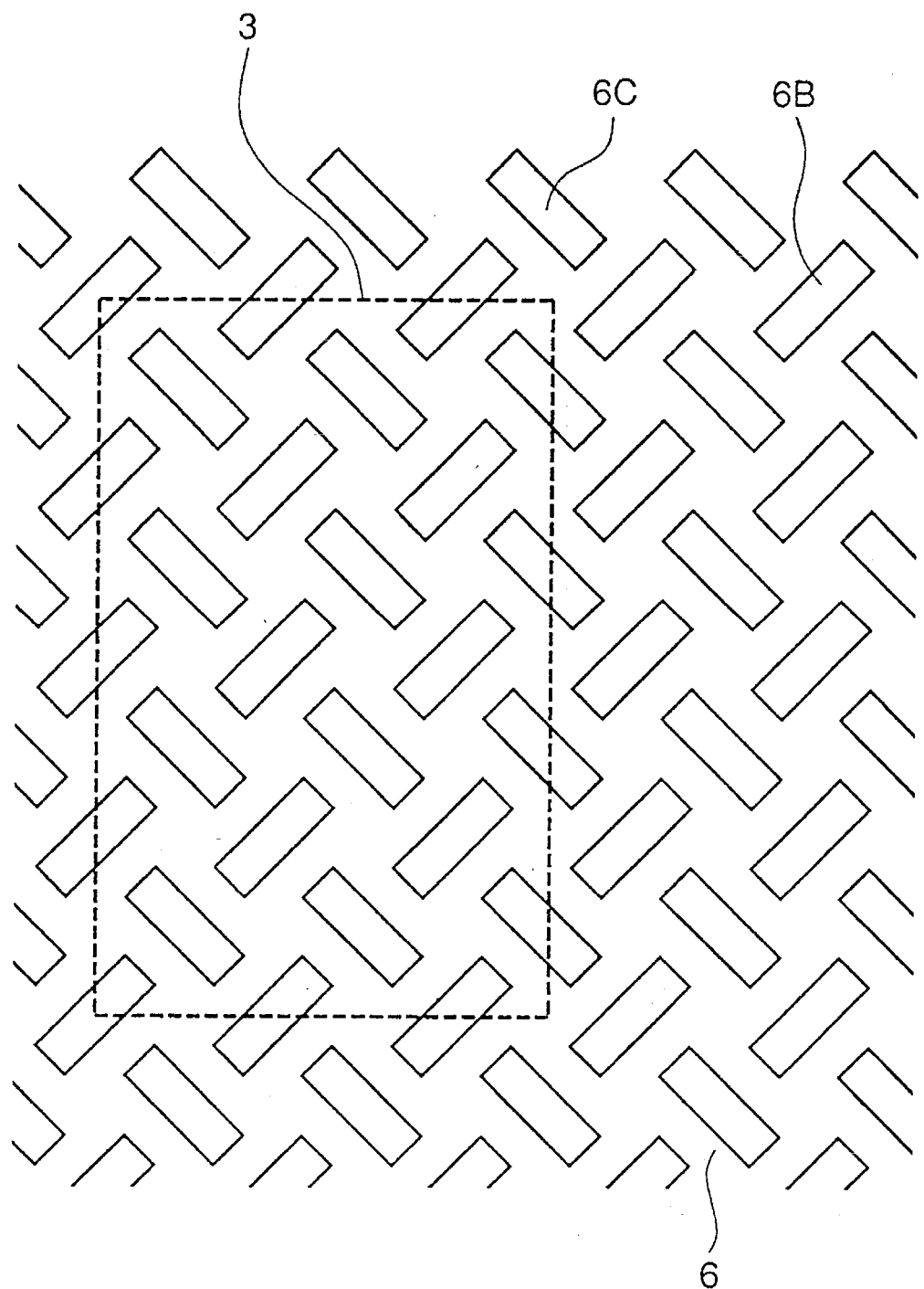
FIG. 15 illustrates a positional relation between the interconnection pattern and the mask pattern when the exposure is performed by using a non-stripe, non-grille, mask pattern, for the purpose of illustrating a fifth embodiment of the process in accordance with the present invention for forming an interlayer insulating film.

The grille mask pattern shown in FIG. 13 has a number of regularly arranged square openings 6A having the same size. However, the pattern of the mask pattern is not limited to the stripe pattern and the grille pattern shown in FIG. 13. For example, a non-stripe, non-grille pattern as shown in FIG. 15 can be used. The pattern shown in FIG. 15 has a number of discrete elongated rectangular openings 6B and 6C regularly arranged orthogonally to each other. The above mentioned fourth embodiment can also be carried out by using the mask pattern shown in FIG. 15.

As seen from the above, according to the present invention, it is possible to selectively form a resist on only the low altitude region in a self-alignment manner and to form a planarized interlayer film by utilizing the resist formed on only the low altitude region. Accordingly, it is no longer necessary to prepare a different mask for each interlayer film formation process. In addition, it is possible to prevent generation of steps such as the "bat wing" generated by the margin between the patterned interconnections and its inverted pattern resist. Furthermore, it is possible to minimize the short-circuit which might occur between the patterned interconnections.

Figure 16:
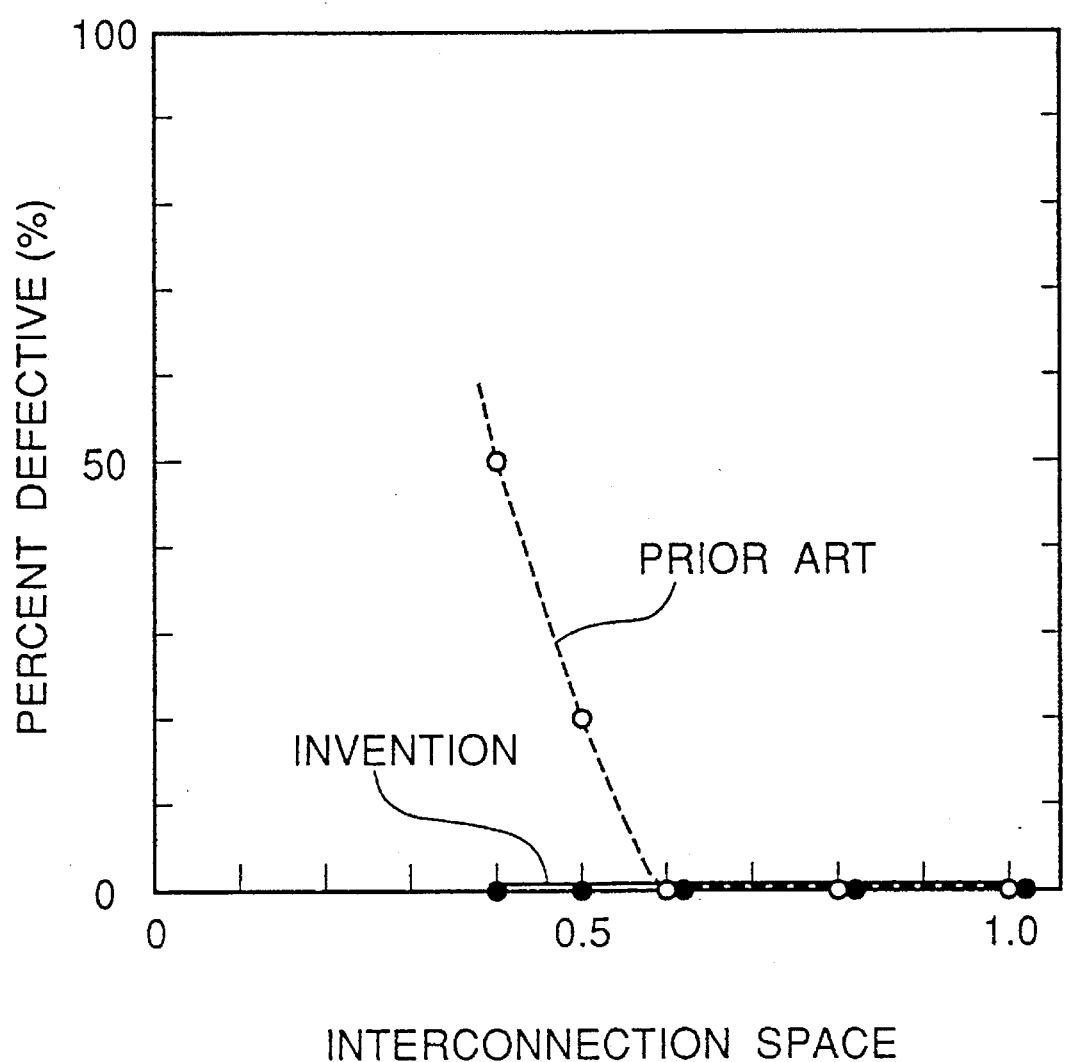
FIG. 16 is a graph illustrating a relation between the interconnection space and the percent defective.

Referring to FIG. 16, there is shown a graph illustrating a relation between the interconnection space and the percent defective in the present invention and in the prior art. It could be understood that the present invention is effective in improving the yield of product when the density of interconnections has elevated.

The invention has thus been shown and described with reference to the specific embodiments. However, it should be noted that the present invention is in no way limited to the details of the illustrated structures but changes and modifications may be made within the scope of the appended claims.

We claim:

1. A process for manufacturing a semiconductor device, including the steps:

selectively forming interconnections on an insulating film formed on a semiconductor substrate;

depositing, over said insulating film and said interconnections, an interlayer insulating film having a thickness greater than that of said interconnections, said interlayer insulating film forming a high altitude region over said interconnections, and a low altitude region over said insulating film;

depositing a photosensitive film on said interlayer insulating film;

exposing said photosensitive film, through a mask having a periodic pattern extending over an entirety of said mask, while causing an exposing light to be focused on said low altitude region; and developing said photosensitive film so that said periodic pattern of said mask is formed on said photosensitive film only in said low altitude region.

2. A process claimed in claim 1 further including the steps of:

depositing a resist film on said periodic pattern of said photosensitive film and said interlayer insulating film so as to cause said resist film to have a substantially planarized surface; and performing an etch-back of said resist film at least until a surface of said interlayer insulating film in said low altitude region is exposed, whereby an upper surface of said interlayer insulating film is planarized.

3. A process claimed in claim 1 wherein said periodic pattern of said mask comprises a stripe pattern extending over the entirety of said mask.

4. A process for manufacturing a semiconductor device, including the steps:

selectively forming interconnections on an insulating film formed on a semiconductor substrate:

depositing, over said insulating film and said interconnections, an interlayer insulating film having a thickness greater than that of said interconnection, said interlayer insulating film forming a high altitude region over said interconnections, and a low altitude region over said insulating film;

depositing a photosensitive film on the surface of said interlayer insulating film;

exposing said photosensitive film, through a mask having a periodic pattern extending over the whole of said mask, while causing an exposing light to be focused on said low altitude region, wherein said periodic pattern of said mask comprises a grille pattern having discrete rectangular openings arranged orthogonal to each other extending over the entirety of said mask; and developing said photosensitive film so that said periodic pattern of said mask is formed on said photosensitive film only in said low altitude region.

5. A process claimed in claim 1 wherein said periodic pattern of said photosensitive film has a pattern film width which is greater than a space between adjacent patterns.

6. A process claimed in claim 1 wherein said periodic pattern of said mask has a pattern which runs parallel over an outline of said interconnections.

7. A process claimed in claim 1 wherein said periodic pattern of said mask has a pattern which runs non-parallel over an outline of said interconnections.

8. A process for manufacturing a semiconductor device, including the steps:

selectively forming interconnections on an insulating film formed on a semiconductor substrate;

depositing, over said insulating film and said interconnections, an interlayer insulating film, said interlayer insulating film over said interconnections forming a high altitude region and said interlayer insulating film over said insulating film forming a low altitude region;

depositing a photosensitive polyimide layer over said interlayer insulating film;

exposing said photosensitive polyimide layer, through a mask having a periodic pattern extending over an entirety of said mask, while causing an exposing light to be focused on said low altitude region; and developing said photosensitive polyimide layer so that said periodic pattern is formed in said photosensitive polyimide on only said low altitude region of said interlayer insulating film.

9. A process claimed in claim 8 further including a step of depositing a second polyimide layer on said periodic pattern of said photosensitive polyimide layer so as to cause said second photosensitive polyimide layer to have a substantially planarized surface.

10. A process claimed in claim 8 wherein said periodic pattern of said mask comprises a stripe pattern extending over the whole of said mask.

11. A process for manufacturing a semiconductor device, including the steps:

selectively forming interconnections on an insulating film formed on a semiconductor substrate;

depositing, over said insulating film and said interconnections, an interlayer insulating film, said interlayer insulating film over said interconnections forming a high altitude region and said interlayer insulating film over said insulating film forming a low altitude region;

depositing a photosensitive polyimide layer over said interlayer insulating film;

exposing said photosensitive polyimide layer, through a mask having a periodic pattern extending over an entirety of said mask, while causing an exposing light to be focused on said low altitude region, wherein said periodic pattern of said mask comprises a grille pattern having discrete rectangular openings arranged orthogonal to each other extending over the entirety of said mask; and developing said photosensitive polyimide layer so that said periodic pattern is formed in said photosensitive polyimide on only said low altitude region of said interlayer insulating film.

12. A process claimed in claim 8 wherein said periodic pattern has a pattern film width which is greater than a space between adjacent patterns.

13. A process claimed in claim 8 wherein said periodic pattern of said mask has a pattern which runs parallel over an outline of said interconnections.

14. A process claimed in claim 8 wherein said periodic pattern of said mask has a pattern which runs non-parallel over an outline of said interconnections.

* * * * *